(12) United States Patent
Jeong et al.

(10) Patent No.: US 10,908,734 B2
(45) Date of Patent: Feb. 2, 2021

(54) DISPLAY DEVICE

(71) Applicant: Samsung Display Co., Ltd., Yongin-Si (KR)

(72) Inventors: Joo Hyeon Jeong, Yongin-si (KR); Heon Seok Lee, Yongin-si (KR); Hyun Wook Cho, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/554,503

(22) Filed: Aug. 28, 2019

(65) Prior Publication Data

US 2020/0225828 A1 Jul. 16, 2020

(30) Foreign Application Priority Data

Jan. 10, 2019 (KR) .................. 10-2019-0003312

(51) Int. Cl.
| | |
|---|---|
| *G06F 3/041* | (2006.01) |
| *G06F 1/16* | (2006.01) |
| *G06F 3/044* | (2006.01) |
| *G09G 3/32* | (2016.01) |
| *H03K 17/955* | (2006.01) |

(52) U.S. Cl.
CPC ........ *G06F 3/04164* (2019.05); *G06F 1/1643* (2013.01); *G06F 3/0412* (2013.01); *G06F 3/0443* (2019.05); *G09G 3/32* (2013.01); *H03K 17/955* (2013.01); *G09G 2300/0426* (2013.01); *G09G 2300/0439* (2013.01)

(58) Field of Classification Search
CPC combination set(s) only.
See application file for complete search history.

(56) References Cited

U.S. PATENT DOCUMENTS

| | | | |
|---|---|---|---|
| 2018/0136363 A1 | 5/2018 | Yoon et al. | |
| 2020/0133479 A1* | 4/2020 | Hua | G06F 3/048 |

FOREIGN PATENT DOCUMENTS

KR 10-2018-0053896 A 5/2018

* cited by examiner

*Primary Examiner* — Deeprose Subedi
(74) *Attorney, Agent, or Firm* — Innovation Counsel LLP

(57) ABSTRACT

A display device may include a display element layer, a sensing element layer, and a second-type sensor electrode. The display element layer may include a first through hole, a non-pixel area, and a display area. The display area may including pixels and may surround the non-pixel area. The non-pixel area may surround the first through hole. The sensing element layer may include a second through hole and a first sensing area. The first sensing area may include first-type sensor electrodes, may overlap the display area, and may surround the second through hole. The second through hole may correspond to the first through-hole. The second-type sensor electrode may overlap the non-pixel area and may be electrically insulated from the first-type sensor electrodes.

20 Claims, 12 Drawing Sheets

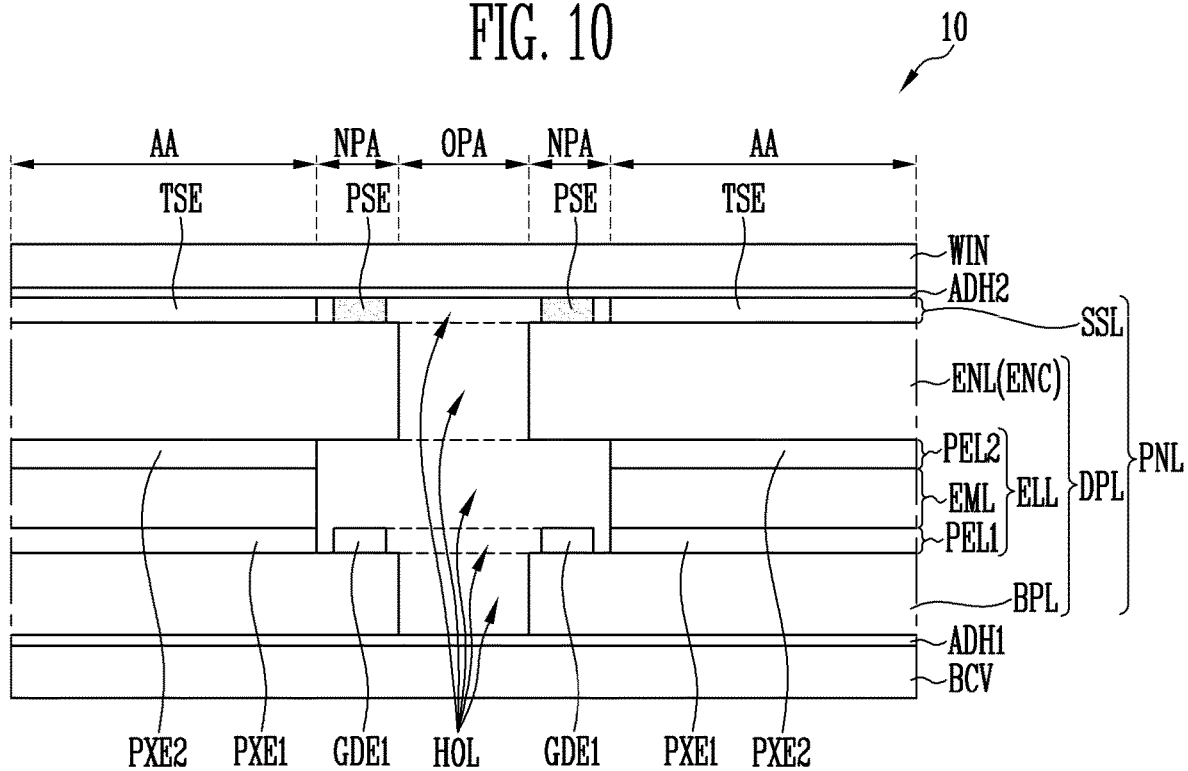
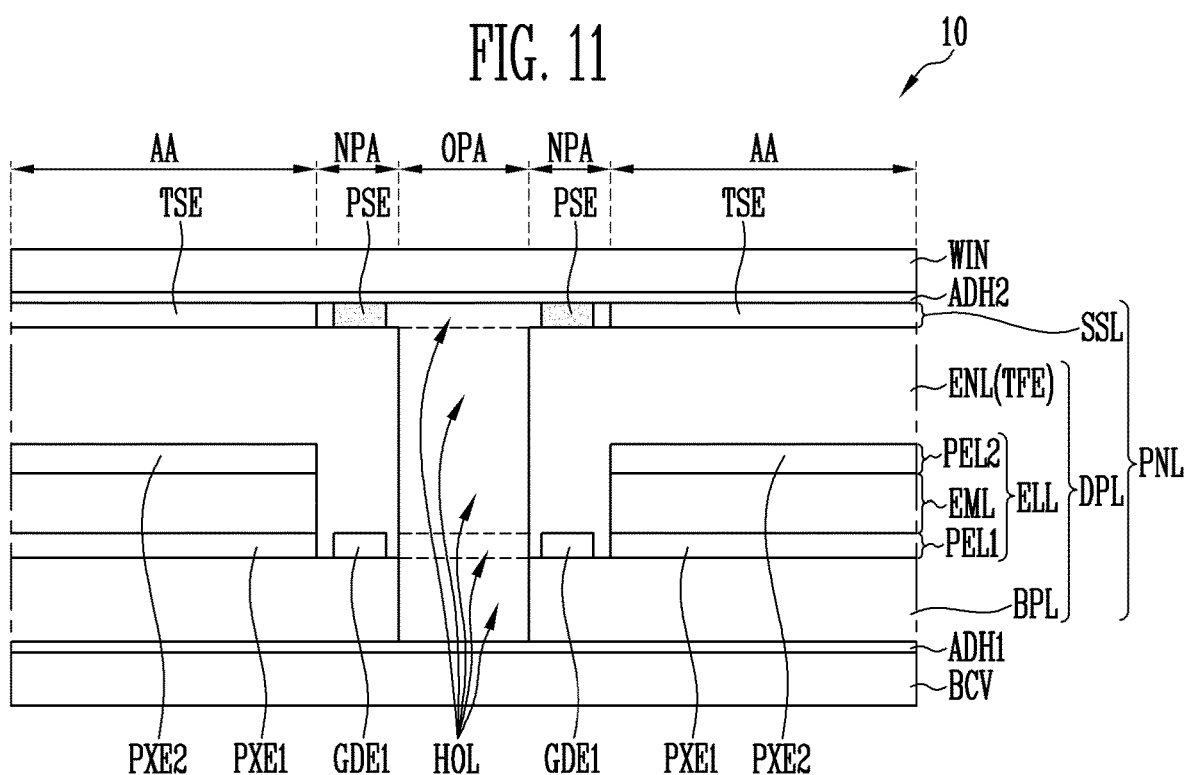

DISPLAY DEVICE

CROSS-REFERENCE TO RELATED APPLICATION

This application claims priority to and the benefit of Korean Patent Application No. 10-2019-0003312 filed in the Korean Intellectual Property Office on Jan. 10, 2019, the entire contents of the Korean Patent Application are incorporated herein by reference.

BACKGROUND (a) Technical Field

The technical field relates to a display device.

(b) Related Art

Display devices may be included in various kinds of electronic devices (such as mobile phones, tablet PCs, and game devices) for displaying images. Additional functions may be integrated with the display devices.

SUMMARY

Embodiments may be related to a display device including sensors.

A display device according to an embodiment includes: an active area; an opening area disposed inside the active area; a non-pixel area disposed between the active area and the opening area to surround the opening area; a display element layer including pixels disposed in the active area and a first through-hole disposed in the opening area; a sensing element layer including a first sensor electrodes disposed in the active area, and a second through-hole disposed in the opening area, wherein the second through-hole overlaps the first through-hole; and a second sensor electrode disposed in the non-pixel area, wherein the second sensor electrode is separated from the first sensor electrodes.

The second sensor electrode may be disposed on the sensing element layer.

The first sensor electrodes may include: a plurality of electrode portions distributed across the active area; and a plurality of connecting portions electrically connected to the electrode portions, and the second sensor electrode may include at least one conductive layer that is disposed on the same layer as at least one of the electrode portions and the connecting portions.

The second sensor electrode may have a multi-layered structure including: a first conductive layer disposed on the same layer as at least some of the connecting portions; and a second conductive layer disposed on the same layer as the electrode portions, wherein the second conductive layer is electrically connected to the first conductive layer.

The display element layer may include: a first pixel electrode layer including first pixel electrodes disposed in each pixel area, wherein the first pixel electrode layer includes a through-hole corresponding to the opening area; an emission layer disposed on the first pixel electrode layer, wherein the emission layer includes a through-hole that corresponds to the opening area and the non-pixel area; and a second pixel electrode layer disposed on the emission layer, wherein the second pixel electrode layer includes a through-hole that corresponds to the opening area and the non-pixel area.

The first pixel electrode layer may further include a first guard electrode that is separated from the first pixel electrodes, wherein the first guard electrode is disposed in the non-pixel area to overlap the second sensor electrode. The first guard electrode may be supplied with the same voltage or signal as that of the second sensor electrode.

The sensing element layer may further includes at least one of: a first guard electrode disposed under the second sensor electrode to overlap the second sensor electrode; a second guard electrode disposed in the non-pixel area to be positioned inside the second sensor electrode, wherein the second guard electrode is separated from the second sensor electrode; and a third guard electrode disposed in the non-pixel area to be positioned between the first sensor electrodes and the second sensor electrode, wherein the third guard electrode is separated from the second sensor electrode.

The first guard electrode, the second guard electrode and the third guard electrode may be respectively supplied with the same voltage or signal as that of the second sensor electrode.

The second sensor electrode may be disposed on the display element layer.

The display device may further include at least one guard electrode disposed on the display element layer, wherein the at least one guard electrode is positioned at a periphery of the second sensor electrode.

The second sensor electrode may have a closed loop shape that surrounds the opening area.

The first sensor electrodes may be formed as a mutual capacitive type touch sensor, and the second sensor electrode may be formed as a self-capacitive type proximity sensor.

The first sensor electrodes may include: a first touch sensor electrode including a plurality of first electrode portions arranged in the active area along a first direction, and at least one first connecting portion for connecting the first electrode portions along the first direction; and a second touch sensor electrode including a plurality of second electrode portions arranged in the active area along a second direction, and at least one second connecting portion for connecting the second electrode portions along the second direction.

The display element layer may further include an encapsulation layer for encapsulating the pixels. The encapsulation layer may include a through-hole that corresponds to the opening area.

The first sensor electrodes and the second sensor electrode may be directly formed or disposed on the encapsulation layer or an insulating layer that is formed on the encapsulation layer.

The display element layer may include a backplane layer that includes circuit elements of the respective pixels, and the second sensor electrode may be disposed on the backplane layer.

The display device may further include a sensor driver that is connected to the first sensor electrodes and the second sensor electrode. The sensor driver may include: a first sensor driving circuit configured to sense a touch input generated on the active area, wherein the first sensor driving circuit is connected to the first sensor electrodes; and a second sensor driving circuit configured to sense an approach of a body or an object, wherein the second sensor driving circuit is connected to the second sensor electrode.

The display device may further include: a window disposed on a display panel to completely cover a top surface of the display panel, wherein the display panel includes the display element layer and the sensing element layer; and a bottom cover disposed under the display panel to completely cover a bottom surface of the display panel.

The display device may further include a full cover case for housing a display panel, wherein the display panel includes the display element layer and the sensing element layer. The full cover case may include: a rear case portion for covering a bottom surface of the display panel; and a front case portion connected to the rear case portion, wherein the front case portion includes a dielectric material contained therein at a position corresponding to that of the second sensor electrode.

A display device according to an embodiment includes a display panel including a display element layer and a sensing element layer. The display panel includes: an active area including pixels disposed on the display element layer, and touch sensor electrodes disposed on the sensing element layer; a through-hole disposed inside the active area; and a non-pixel area disposed between the active area and the through-hole to surround the through-hole, wherein the non-pixel area includes a proximity sensor electrode that is separated from the touch sensor electrodes.

The display device according to the embodiments, the proximity sensor may be formed inside the display panel without requiring additional components or processes for forming the proximity sensor.

An embodiment may be related to a display device. The display device may include a display element layer, a sensing element layer, and a second-type sensor electrode. The display element layer may include a first through hole, a non-pixel area, and a display area. The display area may including pixels and may surround the non-pixel area. The non-pixel area may surround the first through hole. The sensing element layer may include a second through hole and a first sensing area. The first sensing area may include first-type sensor electrodes, may overlap the display area, and may surround the second through hole. The second through hole may correspond to the first through-hole. The second-type sensor electrode may overlap the non-pixel area and may be electrically insulated from the first-type sensor electrodes.

The second-type sensor electrode may surround the second through hole.

The display device may include a first insulating layer. The first-type sensor electrodes may include a first electrode and a first connector. The first electrode may overlap the display area and may directly contact a face of the first insulating layer. The first connector may be electrically connected to the first electrode through a first contact hole in the first insulating layer. The second-type sensor electrode may include a first conductive layer. The first conductive layer may directly contact the face of the first insulating layer.

The second-type sensor electrode may further include a second conductive layer. The second conductive layer may be electrically connected to the first conductive layer through a second contact hole in the first insulating layer.

The display element layer may include a first pixel electrode layer, an emission layer, and a second pixel electrode layer. The first pixel electrode layer may include pixel electrodes of the pixels and may include the first through hole. The emission layer may be disposed between the first pixel electrode layer and the second pixel electrode layer and may include a third through hole. The third through hole may correspond to both the first through hole and the non-pixel area. The second pixel electrode layer may overlap the emission layer, may overlap the pixel electrodes, and may include a fourth through hole. The fourth through hole may correspond to the third through hole.

The first pixel electrode layer may further include a first guard electrode. The first guard electrode may be electrically insulated from the pixel electrodes, may be disposed in the non-pixel area, may overlap the second-type sensor electrode, and may be configured to receive a same non-zero voltage or signal as received by the second-type sensor electrode.

The display device may include at least one of the following elements: a first guard electrode overlapping the second-type sensor electrode; a second guard electrode overlapping the non-pixel area, positioned between two portions of the second-type sensor electrode and electrically insulated from the second sensor electrode; and a third guard electrode overlapping the non-pixel area, positioned between the first-type sensor electrodes and the second-type sensor electrode, and electrically insulated from the second-type sensor electrode.

Each of the first guard electrode, the second guard electrode, and the third guard electrode may be configured to receive a same non-zero voltage or signal as received by the second-type sensor electrode.

The second-type sensor electrode may be disposed on the display element layer.

The display device may include at least one guard electrode disposed on the display element layer and positioned at a periphery of the second-type sensor electrode.

The second-type sensor electrode may have a closed-loop structure that surrounds the first through hole in a plan view of the display device.

The first-type sensor electrodes may form a mutual capacitive type touch sensor. The second-type sensor electrode may form a self-capacitive type proximity sensor.

The first-type sensor electrodes may include the following elements: first-type electrodes arranged in a first direction; a first-type connector electrically connecting the first-type electrodes; second-type electrodes arranged in a second direction different from the first direction; and a second-type connector electrically connecting the second-type electrodes.

The display element layer may further include an encapsulation layer for encapsulating the pixels. The encapsulation layer may include a through hole that corresponds to the first through hole.

The first-type sensor electrodes and the second-type sensor electrode may be disposed directly on the encapsulation layer or an insulating layer that is disposed directly on the encapsulation layer.

The display element layer may include a backplane layer that includes circuit elements of the pixels. The second-type sensor electrode may be disposed directly on the backplane layer.

The display device may further include a sensor driver that is electrically connected to the first-type sensor electrodes and the second-type sensor electrode. The sensor driver may include the following elements: a first sensor driving circuit electrically connected to the first-type sensor electrodes and configured to sense a touch input generated on the first sensing area; and a second sensor driving circuit electrically connected to the second-type sensor electrode and configured to sense an approach of an electrically conductive object.

The display device may include the following elements: a window completely covering a first surface of a combination of the display element layer and the sensing element layer;

and a bottom cover completely covering a second surface of the combination of the display element layer and the sensing element layer.

The display device may include the following elements: a rear cover for covering a rear surface of a combination of the display element layer and the sensing element layer; and a front cover connected to the rear cover and may include a dielectric material part at a position corresponding to the second-type sensor electrode.

An embodiment may be related to a display device. The display device may include the following elements: pixels; touch sensor electrodes; a through hole surrounded by the pixels and surrounded by the touch sensor electrodes; and a proximity sensor electrode disposed outside the through hole, surrounded by the touch sensor electrodes, and electrically insulated from the touch sensor electrodes.

BRIEF DESCRIPTION OF THE DRAWINGS

FIG. 10 is a cross-sectional view of the area AR1 of the display device shown in FIG. 1 according to an embodiment.

FIG. 11 is a cross-sectional view of the area AR1 of the display device shown in FIG. 1 according to an embodiment.

DETAILED DESCRIPTION

Figure 1:
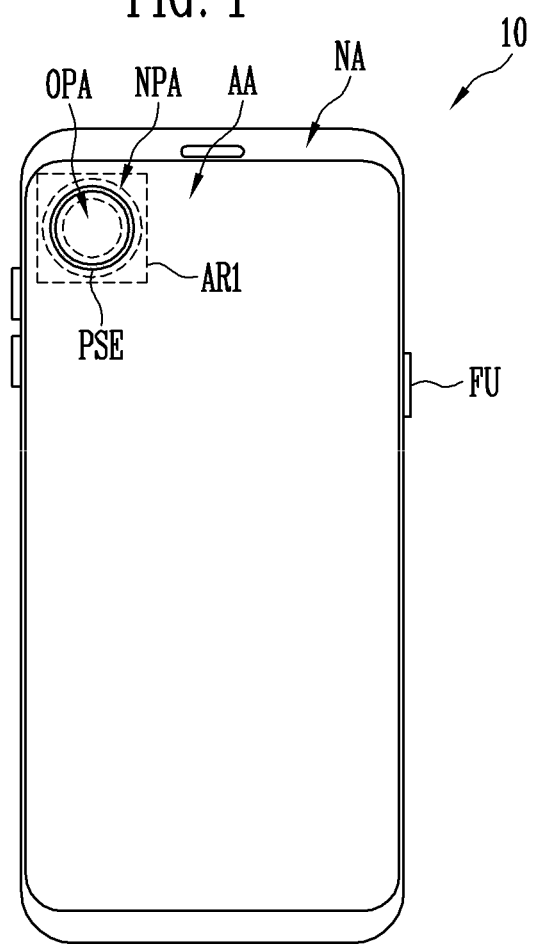
FIG. 1 shows a schematic plan view of a display device according to an embodiment.

Example embodiments are described with reference to the drawings. Practical embodiments may be embodied in various forms.

Some elements in the drawings may be exaggerated in their sizes, ratios, and the like. Like reference numerals and symbols may designate like elements, and related descriptions may not be repeated.

The terms "first," "second," and the like may be used for distinguishing between various elements, and the elements should not be limited by those terms. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

Terms such as "comprises" or "have" may specify the presence of features, numbers, steps, actions, elements, parts, or combinations, and may not exclude the presence or addition of one or more different features, numbers, steps, actions, elements, parts, or combination.

When a first element is referred to as being "on" a second element, the first element can be directly on the second element, or one or more intervening elements may be present between the first element and the second element.

Specific position or direction is described in a relative viewpoint and may be changed depending on different viewpoints or directions.

Singular forms may include plural forms unless the context clearly indicates otherwise.

The term "connect" may mean "electrically connect." The term "conductive" may mean "electrically conductive." The term "insulate" may mean "electrically insulate" or "electrically isolate." The term "through-hole" may mean "through hole." The expression that a first hole overlaps a second hole may mean that the area/position of the first hole overlaps the area/position of the second hole. The expression that a shape of a first element corresponds to a shape of a second element may mean that a perimeter of the first element is similar to or identical to a perimeter of the second element. The expression that two conductive elements are disposed on the same layer may mean that the two conductive elements directly contact a same face of a same insulating layer and/or that the two conductive elements are included in a same conductive structural layer.

FIG. 1 shows a display device 10 according to an embodiment. For example, FIG. 1 is a schematic top plan view of the display device 10 according to an embodiment.

Referring to FIG. 1, the display device 10 includes an active area AA, and a non-active area NA surrounding the active area AA. The display device 10 includes an opening area OPA that is disposed inside and/or surrounded by the active area AA, and a non-pixel area NPA that is disposed between the active area AA and the opening area OPA and surrounds the opening area OPA. The display device 10 may optionally further include a function key FU and the like.

The active area AA may include a display area in which pixels are disposed. The active area AA may include a touch sensing area in which touch sensor electrodes (also referred to as "first sensor electrodes") are disposed. The display area and the touch sensing area may overlap each other. In embodiments, only a portion of the display area may be overlap a touch sensing area, or the display area and the touch sensing area may not overlap each other. The display area and the touch sensing area may be collectively referred to as an active area AA.

The non-active area NA may be a non-display area that includes no pixels and may surround the active area AA. In some embodiments, various kinds of wires connected to the pixels and touch sensor electrodes of the active area AA are disposed in the non-active area NA. In this specification, the term "connection" may refer to a physical connection and/or an electrical connection.

The display device 10 may have a HIAA (Hole in Active Area) panel structure. The non-pixel area NPA may be disposed between the opening area OPA and the active area AA. The non-pixel area NPA may be disposed inside the active area AA, and the opening area OPA may be disposed inside the non-pixel area NPA.

One or more components, such as a camera, may be disposed under/in the opening area OPA or may overlap the opening area OPA. The component may be integrated with the active area AA. One or more functions of the one or more components may be integrated with one or more functions of the active area AA.

The non-pixel area NPA may be disposed outside the opening area OPA and may surround the opening area OPA. The non-pixel area NPA may include no pixels and may be surrounded by neighboring pixels.

The opening area OPA may include a through-hole that penetrates through at least some layers of the display panel. For example, the opening area OPA may include a through-hole that penetrates through a display element layer in which pixels are disposed and/or a sensing element layer in which predetermined sensor electrodes are disposed.

For convenience of a user, the function key FU may be disposed at the outside of the display device 10. At least one function key FU may be disposed at one or more sides of the display device 10.

The display device 10 may further include at least one proximity sensor electrode (PSE), also referred to as a "second sensor electrode," that is disposed in the non-pixel area NPA. The proximity sensor electrode PSE may have a closed loop structure that surrounds the opening area OPA. The proximity sensor electrode PSE may form a capacitive type proximity sensor. For example, the proximity sensor electrode PSE may form a self-capacitive type proximity sensor.

When a human body or a different conductive object approaches the proximity sensor electrode PSE within an effective sensing distance, capacitance of the proximity sensor electrode PSE changes. For example, the proximity sensor electrode PSE may receive a predetermined input signal (for example, a driving signal) through a wire (not shown) for a period during which the proximity sensor is activated (for example, a period during which the display device 10 is turned on). When a conductive object approaches the proximity sensor electrode PSE within an effective sensing distance, capacitance of the proximity sensor electrode PSE changes according to the distance (for example, proximity) to the object. Accordingly, the proximity sensor electrode PSE outputs a sensing signal that is different from the input signal. For example, the sense signal may have a magnitude and/or waveform corresponding to proximity to the object. Therefore, even if the object is not in direct contact with the proximity sensor electrode PSE, whether the object approaches the proximity sensor electrode PSE and the proximity to the object can be detected.

Figure 2:
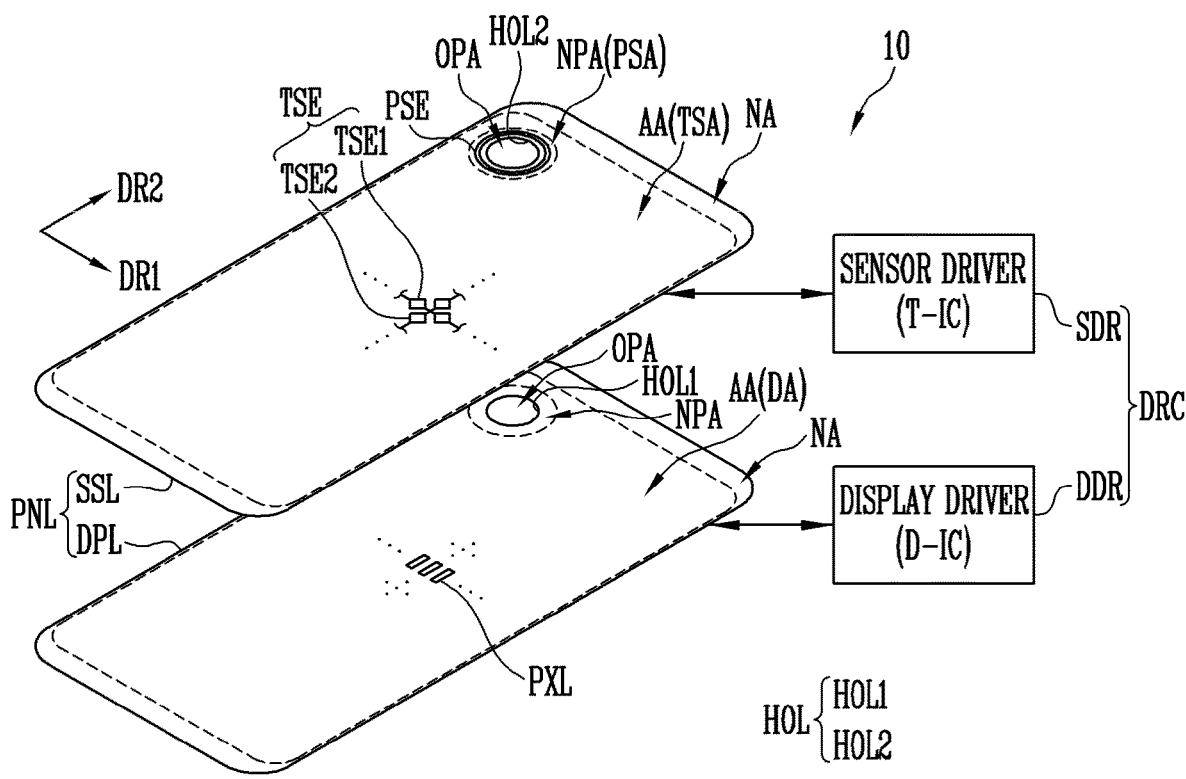
FIG. 2 shows a schematic exploded view illustrating layers of a display device according to an embodiment.
Figure 3:
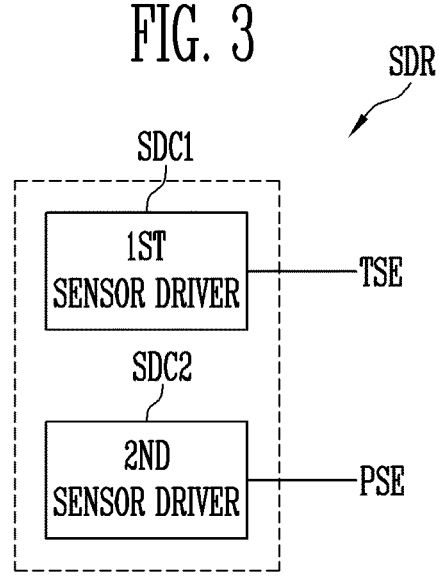
FIG. 3 shows a block diagram of a configuration of a sensor driver according to an embodiment.

FIG. 2 shows a configuration of a display device 10 according to an embodiment. For example, FIG. 2 shows layers of the display device 10 shown in FIG. 1, and the same or similar components as those in FIG. 1 are denoted by the same reference numerals in in FIG. 2. FIG. 3 shows a configuration of a sensor driver SDR according to an embodiment. For example, FIG. 3 shows an embodiment of the sensor driver SDR in FIG. 2.

Referring to FIG. 2 and FIG. 3, the display device 10 includes a display panel PNL (which includes a display element layer DPL and a sensing element layer SSL) and a driving circuit DRC for driving the display panel PNL. The display element layer DPL and the sensing element layer SSL may overlap each other. For example, the sensing element layer SSL may be disposed on top of the display element layer DPL.

The driving circuit DRC may include a display driver DDR for driving the display element layer DPL, and a sensor driver SDR for driving the sensing element layer SSL. The display driver DDR and the sensor driver SDR may be separated from each other, or at least some of them may be integrated together into one driver IC.

The display element layer DPL includes a plurality of pixels PXL that are disposed in the active area AA, and a first through-hole HOL1 that is disposed in the opening area OPA. The pixels PXL are connected to signal lines such as scan lines and data lines, and may emit light with luminance corresponding to a driving signal supplied from the display driver DDR. Accordingly, an image corresponding to image data may be displayed in the active area AA of the display element layer DPL. The active area AA of the display device 10 may include the display area DA of the display element layer DPL.

The sensing element layer SSL includes a plurality of touch sensor electrodes (TSE, first sensor electrodes) that are disposed in the active area AA, a proximity sensor electrode (PSE, second sensor electrode) that is disposed in the non-pixel area NPA and separated (and insulated) from the touch sensor electrodes TSE, and a second through-hole HOL2 that is disposed in the opening area OPA. The proximity sensor electrode PSE may be disposed on the sensing element layer SSL, as shown in FIG. 2. In another embodiment, the proximity sensor electrode PSE may be disposed inside the display element layer DPL. For example, the proximity sensor electrode PSE may be disposed around the first through-hole HOL1 of the display element layer DPL.

The touch sensor electrodes TSE may overlap the pixels PXL. For example, one of the touch sensor electrodes TSE may at least partially overlap at least one pixel area. A pixel area may include a pixel circuit area in which a pixel circuit of a pixel PXL is formed, a pixel electrode area in which a pixel electrode is disposed, and/or a light-emitting area of a pixel defined by a pixel defining layer.

In an embodiment, the touch sensor electrodes TSE may not overlap the pixels PXL. For example, each touch sensor electrode TSE may be a mesh-shaped electrode that includes a plurality of openings, and thin wires for forming the mesh-shaped electrode may be disposed between the pixels PXL and may not overlap the pixels PXL.

The second through-hole HOL2 may overlap the first through-hole HOL1. The first through-hole HOL1 and the second through-hole HOL2 may collectively form one through-hole HOL. The through-hole HOL may include the first through-hole HOL1 and the second through-hole HOL2 and may penetrate through the display panel PNL.

The touch sensor electrodes TSE may form a capacitive type touch sensor. For example, the touch sensor electrodes TSE may form a mutual capacitive type touch sensor.

The touch sensor electrodes TSE may include first touch sensor electrodes TSE1 that are supplied with a driving signal from a sensor driver SDR and may include second touch sensor electrodes TSE2 for outputting (to the sensor driver SDR) a sensing signal corresponding to the driving signal. Capacitance may be formed between the first touch sensor electrodes TSE1 and the second touch sensor electrodes TSE2. The first and second touch sensor electrodes TSE1 and TSE2 may extend in different directions in the active area AA. For example, the first touch sensor electrodes TSE1 may extend in a first direction DR1 in the active area AA, while the second touch sensor electrodes TSE2 may extend in a second direction DR2 and may cross the first touch sensor electrodes TSE1 in the active area AA.

In an embodiment, the touch sensor electrodes TSE may form self-capacitive type touch sensor electrodes.

When a touch occurs on the active area AA, capacitance between the sensor electrodes TSE changes in an area where the touch occurs and/or around the area. Accordingly, the touch input may be detected by sensing a change in capacitance. The active area AA of the display device 10 may include the touch sensing area TSA (also referred to as a "first sensing area") of the sensing element layer SSL.

The proximity sensor electrode PSE is disposed in the non-pixel area NPA and is separated from the touch sensor electrodes TSE. When a body or an object approaches the proximity sensor electrode PSE, capacitance of the proximity sensor electrode PSE changes. Accordingly, a change in capacitance may be detected, thereby enabling recognition of the approach of a body or an object. The non-pixel area NPA of the display device 10 may include the proximity sensing area PSA (also referred to as a "second sensing area") of the sensing element layer SSL.

The proximity sensor electrode PSE may include at least one conductive layer that is disposed on the same layer as at least one conductivity pattern for forming the touch sensor electrodes TSE. The touch sensor electrodes TSE and the proximity sensor electrode PSE may be simultaneously formed. A conductive material used to form the touch sensor electrodes TSE may be used to form the proximity sensor electrode PSE. The proximity sensor may be formed inside the display panel PNL without requiring additional components or processes for forming proximity sensor electrode PSE.

The display driver DDR is electrically connected to the display element layer DPL, particularly to the pixels PXL that are disposed on the display element layer DPL. The display driver DDR supplies a driving signal to the pixels PXL. For example, the display driver DDR includes a scan driver for supplying scan signals to the pixels PXL through scan lines, a data driver for supplying data signals to the pixels PXL through data lines, and a timing controller for controlling the scan driver and the data driver. The scan driver, the data driver, and/or the timing controller may be integrated into one display IC (D-IC). In another embodiment, the scan driver, the data driver, and/or the timing controller may be formed or mounted on the display element layer DPL together with the pixels PXL.

The sensor driver SDR is electrically connected to the sensor electrode layer SSL, particularly to the touch sensor electrodes TSE and the proximity sensor electrode PSE that are disposed on the sensor electrode layer SSL. For example, the sensor driver SDR may include a first sensor driving circuit SDC1 that is connected to the touch sensor electrodes TSE to sense a touch input generated from the active area AA, and a second sensor driving circuit SDC2 that is connected to the proximity sensor electrode PSE to sense the approach of a body or an object.

The display device 10 includes a touch sensor including the touch sensor electrodes TSE, and a proximity sensor including the proximity sensor electrode PSE. Accordingly, the display device 10 may perform sensing functions in addition to image-displaying functions.

Figure 4:
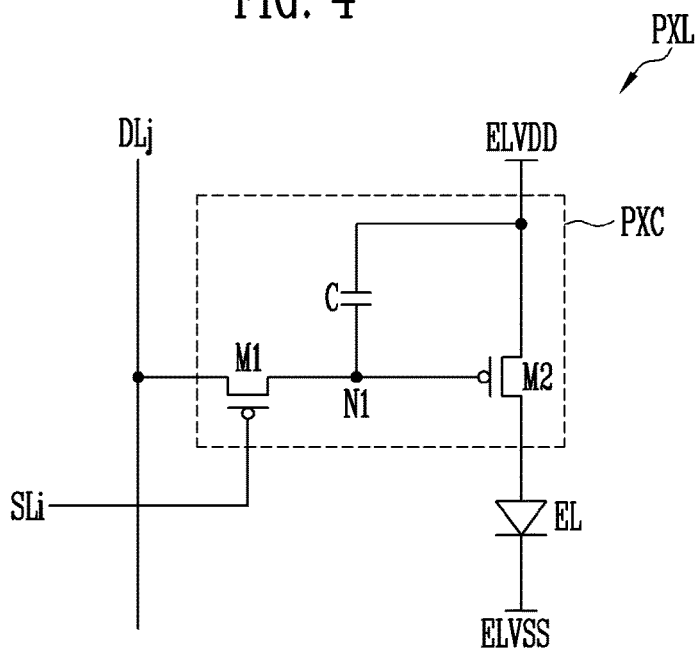
FIG. 4 shows a circuit diagram of a pixel according to an embodiment.

FIG. 4 shows a circuit diagram of a pixel PXL according to an embodiment. For example, FIG. 4 shows a pixel PXL disposed in the display area DA. For example, FIG. 4 shows a pixel PXL disposed in an i-th (i is a natural number) row and a j-th row (j is a natural number) of the active area AA. Pixels PXL disposed in the active area AA of FIGS. 1 and 2 may have substantially the same structure as each other. For example, the pixels PXL may be formed in a repeated pattern in the display area DA while having the same structure in which each pixel circuit PXC is disposed and a light-emitting element layer in which each light-emitting element EL is disposed. In another embodiment, at least one pixel PXL may have a structure that is different from those of the remaining pixels PXL.

Referring to FIG. 4, a pixel PXL may include a light-emitting element EL that is connected between a first power supply ELVDD and a second power supply ELVSS, and a pixel circuit PXC that is connected between the first power supply ELVDD and the light-emitting element EL, wherein the pixel circuit PXC is further connected to a scan line SLi and a data line DLj to control a driving current flowing to the light-emitting element EL. However, the position of the pixel circuit PXC is not limited thereto. For example, the pixel circuit PXC may also be connected between the light-emitting element EL and the second power supply ELVSS. When pixel PXL is a passive pixel, the pixel circuit PXC may be omitted. In this case, opposite ends (for example, anode and cathode) of the light-emitting element EL are may also be directly connected to a predetermined power line (for example, first or second power lines) or a predetermined signal line (for example, the scan line SLi or the data line DLj), respectively.

The first power supply ELVDD and the second power supply ELVSS have different potentials. For example, the first power supply ELVDD may be set as a high-potential power supply, and the second power supply ELVSS may be set as a low-potential power supply. A potential difference between the first power supply ELVDD and the second power supply ELVSS, that is, a voltage applied between them may be greater than a threshold voltage of the light-emitting element EL.

The light-emitting element EL is connected to the first power supply ELVDD through the pixel circuit PXC. For example, an anode of the light-emitting element EL may be connected to the first power supply ELVDD through a second transistor M2 of the pixel circuit PXC. A cathode of the light-emitting element EL may be connected to the second power supply ELVSS. The light-emitting element EL emits light with luminance corresponding to a driving current that is supplied from the pixel circuit PXC. The light-emitting element EL may be an organic light emitting diode (OLED) including an organic light emitting layer. In another embodiment, tiny inorganic light-emitting elements such as nanoscale or microscale light-emitting elements may form a light source of the pixel PXL.

The pixel circuit PXC may include first and second transistors M1 and M2 and a capacitor C.

The first transistor M1 (also referred to as a "switching transistor") is connected between the data line DLj and a first node N1. A gate electrode of the first transistor M1 is connected to the scan line SLi. The first transistor M1 is turned on when a scan signal having a gate-on voltage (for example, a low voltage) is supplied to the scan line SLi to electrically connect the data line DLj and the first node N1. Accordingly, when the first transistor M1 is turned on, a data signal supplied to the data line DLj is transmitted to the first node N1.

A second transistor (also referred to as a "driving transistor") M2 is connected between the first power supply ELVDD and the light-emitting element EL. A gate electrode of the second transistor M2 is connected to the first node N1. The second transistor M2 controls the driving current flowing to the light-emitting element EL according to a voltage of the first node N1. For example, the second transistor M2 may control whether to supply the driving current or not and/or a magnitude of the driving current according to the voltage of the first node N1.

A capacitor C is connected between the first power supply ELVDD and the first node N1. This capacitor C stores a voltage that corresponds to the data signal supplied to the first node N1 in each frame period.

The type and structure of the pixel PXL are not limited to those shown in FIG. 4 and may be configured according to embodiments.

Figure 5:
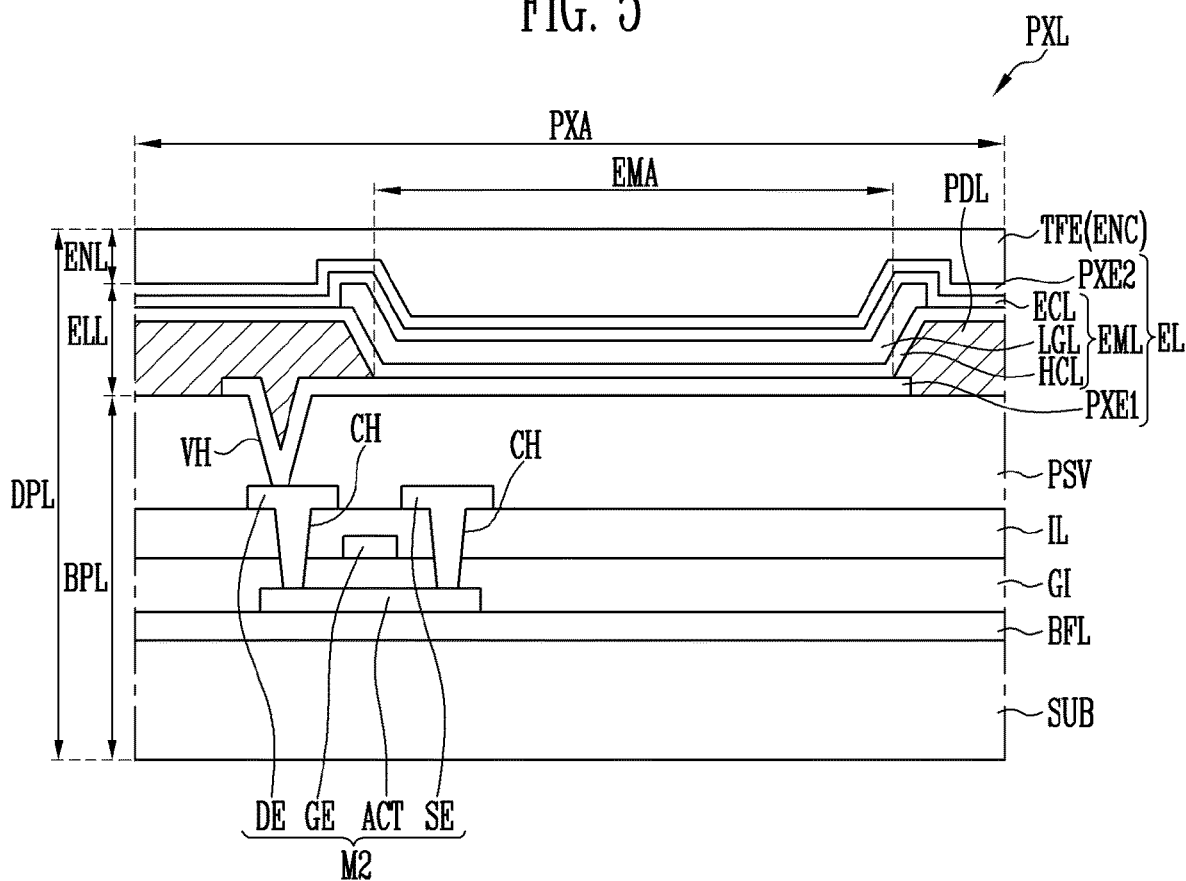
FIG. 5 shows a cross-sectional view of a pixel according to an embodiment.

FIG. 5 shows a cross-sectional view of a pixel PXL according to an embodiment. For example, FIG. 5 shows an embodiment of a cross-section of the pixel PXL shown in FIG. 4. For ease of description, only one area of the pixel PXL (for example, an area where a light-emitting element EL and a second transistor M2 connected thereto are disposed) is shown in FIG. 5. A first transistor M1 may have substantially the same or similar cross-sectional structure as the second transistor M2. At least one of electrodes of the capacitor C may be disposed on the same layer as at least one of electrodes of the first and second transistors M1 and M2.

Referring to FIGS. 4 and 5, each pixel PXL may be formed on one surface of a base substrate SUB that is used as a base of a display panel (PNL in FIG. 2). For example, each pixel PXL may be formed in each pixel region PXA on the base substrate SUB.

The base substrate SUB may be a hard or soft substrate, and its physical properties and materials are not particularly limited. For example, the base substrate SUB may be a rigid substrate that is made of glass or tempered glass, a flexible thin film substrate, or at least one insulating layer.

In some embodiments, a buffer layer BFL may be formed on one surface of the base substrate SUB. The buffer layer BFL can prevent impurities from the base substrate SUB from being diffused and improve flatness of the base substrate SUB. The buffer layer BFL may be provided as a single layer but may also be provided as a multilayer of two or more layers. The buffer layer BFL may be an inorganic insulating layer that is made of an inorganic material. For example, the buffer layer BFL may be formed of a silicon nitride, a silicon oxide, and a silicon oxynitride. When the buffer layer BFL is provided as a multilayer, each layer may be formed of the same material or different materials. In another embodiment, the buffer layer BFL may be unnecessary.

The second transistor M2 as well as various kinds of circuit elements for forming a pixel circuit PXC may be formed on the buffer layer BFL. In a process of forming the circuit elements, wires including various power lines and/or signal lines may be formed together. In the process of forming the circuit elements of the pixel circuit PXC, first and second power lines for providing the first power supply ELVDD and the second power supply ELVSS, and the scan line SLi and the data line DLj for transmitting scan and data signals to each pixel PXL may be formed together.

The second transistor M2 includes an active layer ACT, a gate electrode GE, a source electrode SE, and a drain electrode DE. The active layer ACT is disposed on the buffer layer BFL, and may be formed of a semiconductor material. For example, the active layer ACT may be a semiconductor pattern that is made of polysilicon, amorphous silicon, or an oxide semiconductor, and may be a semiconductor layer doped with impurities or not doped with impurities. Alternatively, only one region of the active layer ACT may be selectively doped with impurities.

A gate insulating layer GI may be formed on the active layer ACT, and a gate electrode GE may be formed on the gate insulating layer GI. The scanning line SLi may be formed together when forming the gate electrode GE.

An interlayer insulating film IL may be formed on the gate electrode GE, and a source electrode SE and a drain electrode DE may be formed on the interlayer insulating film IL. The source electrode SE and the drain electrode DE may be connected to different regions of the active layer ACT by each contact hole CH that penetrates through the gate insulating layer GI and an interlayer insulating layer IL.

FIG. 5 shows that the source electrode SE and the drain electrode DE are formed on layers different from the active layer ACT. In an embodiment, the source electrode SE and/or the drain electrode DE may be formed such that they integrally extend from opposite ends of the active layer ACT.

A passivation layer PSV may be formed on the source electrode SE and the drain electrode DE. The passivation layer PSV may completely cover the pixel circuit PXC including the second transistor M2 and substantially planarize a top surface thereof.

The base substrate SUB, the circuit elements formed at one surface of the base substrate SUB (for example, a second transistor M2 and circuit elements of each pixel circuit PXC), and various kinds of power lines and/or wires formed together with the circuit elements may form a backplane layer BPL of the display device 10. For example, the backplane layer BPL may include the base substrate SUB, a circuit element layer (a circuit element layer formed with the pixel circuit (PXC), and/or various kinds of wires) formed on one surface of the base substrate SUB.

A light-emitting element EL may be formed on the passivation layer PSV. Each light-emitting element EL includes a first pixel electrode PXE1, an emission layer EML, and a second pixel electrode PXE2 that are sequentially disposed on a light-emitting area EMA of the corresponding pixel PXL.

The first pixel electrode PXE1 may be disposed on the passivation layer PSV such that it is connected to one electrode of the second transistor M2, for example, a drain electrode DE thorough a via hole VH that penetrates through the passivation layer PSV. The first pixel electrode PXE1 may be an anode of the light-emitting element EL.

On one surface of the base substrate SUB formed with the first pixel electrode PXE1, a pixel defining layer PDL for partitioning each pixel area, particularly the light-emitting area EMA of each pixel PXL may be formed. The pixel defining layer PDL is disposed between respective light-emitting areas EMA of the pixels PXL, and includes an opening that exposes the first electrode PXE1 in each light-emitting area EMA. For example, the pixel defining layer PDL may protrude upward along an outer circumference of the light-emitting areas EMA from one surface of the base substrate SUB formed with the first electrode PXE1 and the like.

An emission layer EML may be formed in each light-emitting area EMA that is surrounded by the pixel defining layer PDL. For example, the emission layer EML may be disposed on a surface of the exposed first pixel electrode PXE1. The emission layer EML may have a multi-layered thin film structure that includes at least a light generation layer LGL. For example, the emission layer EML may include a light generation layer LGL for emitting light of a predetermined color, a first common layer HCL disposed between the light generation layer LGL and the first pixel electrode PXE1, and a second common layer ECL disposed between the light generation layer LGL and the second pixel electrode PXE2. The first common layer HCL may include at least one of a hole injection layer and a hole transport layer. The second common layer ECL may include at least one of a hole blocking layer, an electron transport layer, and an electron injection layer. The light generation layer LGL may be separately patterned according to each light-emitting area EMA. The first common layer HCL and the second common layer ECL may be formed on the entire active area (AA in FIG. 2).

The second pixel electrode PXE2 is formed on the emission layer EML. The second pixel electrode PXE2 may be a cathode of the light-emitting element EL. The second pixel electrode PXE2 may be formed on the entire active area AA.

The first pixel electrodes PXE1 disposed in each pixel area PXA, the emission layer EML disposed on the first pixel electrodes PXE1, and the second pixel electrode PXE2 disposed on the emission layer EML may form a light-emitting element layer ELL of the display device 10. For example, the light-emitting element layer ELL may include a second pixel electrode layer that is formed by a first pixel electrode layer including the first pixel electrodes PXE1, the emission layer EML disposed on the first pixel electrodes PXE1, and the second pixel electrode PXE2 disposed on the emission layer EML.

On the second pixel electrode PXE2, a thin film encapsulation layer TFE is formed to cover the second pixel electrode PXE2. The thin film encapsulation layer TFE may be disposed in one area (e.g., at least active area AA) of the display panel (PNL in FIG. 2) in which the pixels PXL are disposed, thereby encapsulating the pixels PXL. When the thin film encapsulation layer TFE is used, the display panel PNL may have a reduced thickness and flexibility thereof is secured while protecting the pixels PXL.

The thin film encapsulation layer TFE may have a multilayer structure or a single layer structure. For example, the thin film encapsulation layer TFE may form a multilayer that includes at least two inorganic layers overlapping each other and at least one organic layer interposed between the inorganic layers. Alternatively, in another embodiment, the thin film encapsulation layer TFE may form a single organic/inorganic hybrid insulating layer. The thin film encapsulation layer TFE may be replaced with an encapsulation substrate ENC that is made of glass or plastic. For example, the encapsulation substrate ENC may be disposed on the active area AA to encapsulate at least the pixels PXL. The thin film encapsulation layer TFE or the encapsulation substrate ENC for encapsulating the pixels PXL may form the encapsulation layer ENL of the display device 10.

In some embodiments, a backplane layer BPL including a base substrate SUB and optionally including a circuit element layer (a circuit layer in which circuit elements of each pixel circuit PXC and various kinds of wires connected thereto are disposed), a light-emitting element layer ELL including light-emitting elements EL disposed in each pixel area PXA on the backplane layer BPL, and encapsulation layer ENL disposed on the pixels PXL including the light-emitting elements EL may form the display element layer DPL of the display device 10. For example, the display device 10 may include a display element layer DPL that includes a backplane layer BPL, a light-emitting element layer ELL, and an encapsulation layer ENL. The display element layer DPL is formed inside the display panel PNL so that a predetermined image is displayed on the display panel PNL.

Figure 6:
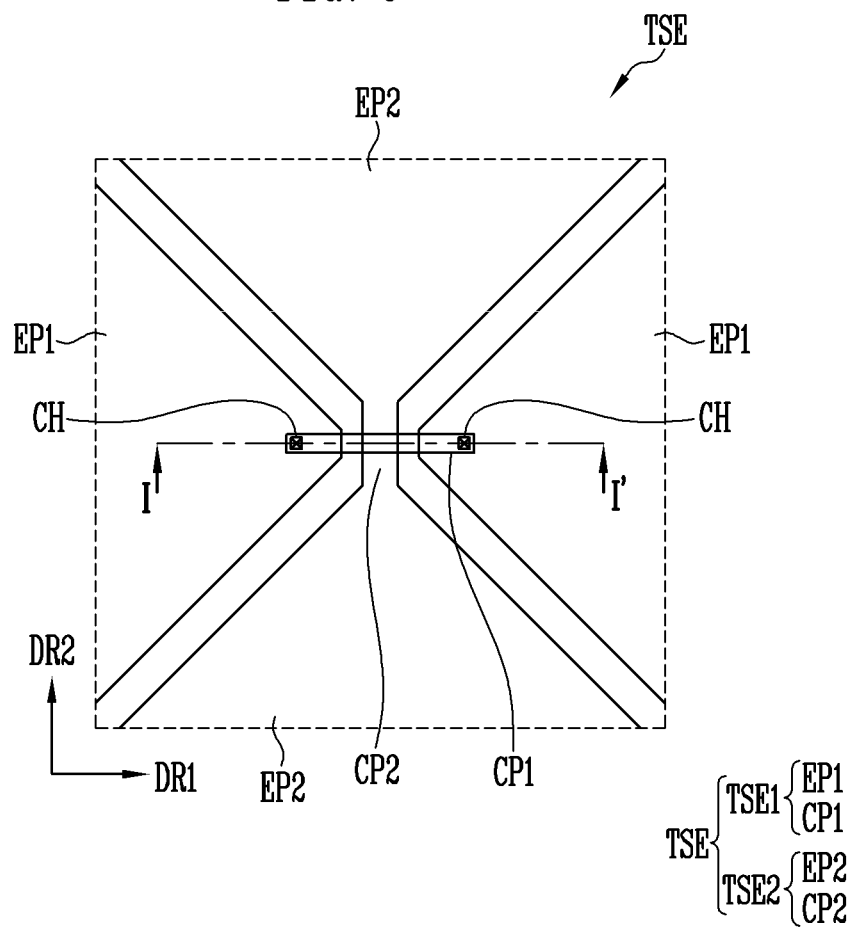
FIG. 6 shows a plan view illustrating touch sensor electrodes according to an embodiment.
Figure 7:
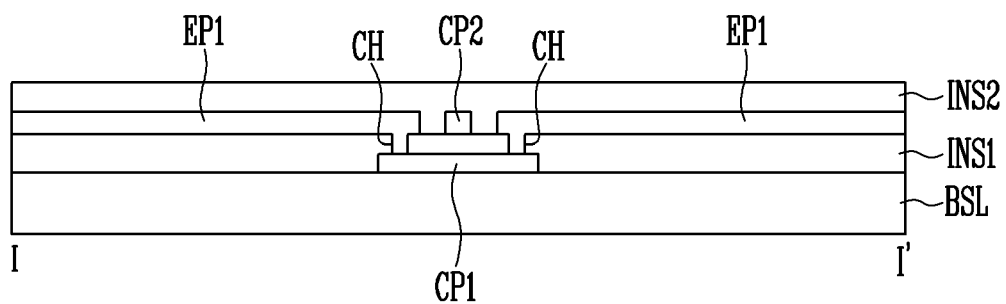
FIG. 7 shows a cross-sectional view taken along the line I-I' of FIG. 6 according to an embodiment.

FIG. 6 shows touch sensor electrodes TSE according to an embodiment. For example, FIG. 6 shows a structure of the touch sensor electrodes TSE based on an intersection of a pair of touch sensor electrodes TSE disposed in an active area AA in FIG. 1 and FIG. 2 (particularly, a touch sensing area TSA of a sensing element layer SSL). FIG. 7 shows an embodiment of a cross-section of FIG. 6 taken along the line I-I'.

Referring first to FIG. 6 together with FIGS. 1 and 2, a touch sensor electrodes TSE includes a plurality of first and second electrode portions EP1 and EP2 that are distributed across the active area AA, and first and second connecting portions CP1 and CP2 that are respectively connected to the first and second electrode portions EP1 and EP2. The first and second electrode portions EP1 and EP2 may be alternately disposed to not overlap each other. The first and second connecting portions CP1 and CP2 may respectively connect the first and second electrode portions EP1 and EP2 along first and second directions DR1 and DR2.

For example, the touch sensor electrodes TSE may include a first touch sensor electrode TSE1 that is extended or connected along the first direction DR1 in the active area AA, and a second touch sensor electrode TSE2 that is extended or connected along the second direction DR2 in the active area AA to cross the first touch sensor electrode TSE1. A plurality of first touch sensor electrodes TSE1 separated from each other, and a plurality of second touch sensor electrodes TSE2 that are separated from each other and cross the first touch sensor electrodes TSE1 may be disposed in the active area AA.

In some embodiments, each of the first touch sensor electrodes TSE1 may include a plurality of first electrode portions EP1 arranged along the first direction DR1 in the active area AA, and at least one first connecting portion CP1 for connecting the first electrode portions EP1 in the first direction DR1. The first electrode portions EP1 and the first connecting portion CP1 may be integrally or non-integrally connected. For example, the first electrode portions EP1 and the first connecting portions CP1 corresponding to the first electrode portions EP1 may be disposed on different layers such that they are electrically connected to each other through respective contact holes CH.

In some embodiments, each of the second touch sensor electrodes TSE2 may include a plurality of second electrode portions EP2 that are arranged in the active area AA along the second direction DR2, and at least one second connecting portion CP2 for connecting the second electrode portions EP2 along the second direction DR2. The second electrode portions EP2 and the second connecting portion CP2 may be integrally or non-integrally connected. For example, the second electrode portions EP2 and the second connecting portion CP2 corresponding to the second electrode portions EP2 may be disposed on the same layer such that they are integrally connected.

The first and second touch sensor electrodes TSE1 and TSE2 may be insulated from each other by at least one insulating layer. For example, as shown in FIG. 7, a first insulating layer INS1 may be interposed between at least the first and second connecting portions CP1 and CP2.

Referring to FIG. 6 and FIG. 7, the touch sensor electrodes TSE may be disposed on one surface of a base layer BSL. The base layer BSL serves as a base substrate of the sensing element layer SSL, and may be provided as a separate substrate for forming the sensing element layer SSL, or may be any one of elements for forming the display element layer DPL that is previously described. For example, the base layer BSL may be an encapsulation layer ENL (for example, a thin film encapsulation layer TFE or an encapsulation substrate ENC) that is disposed on top of the display element layer DPL. In this case, the touch sensor electrodes TSE is directly formed and/or disposed on the encapsulation layer ENL, and the display element layer DPL and the sensing element layer SSL may form a sensor-integrated type display panel (for example, a touch sensor-integrated type display panel).

In one embodiment, at least one first connecting portion CP1 is disposed on one surface of the base layer BSL, and a first insulation layer INS1 is formed on one surface of the base layer BSL on which the first connecting portion CP1 is disposed. FIG. 7 shows that the first connecting portion CP1 is directly formed and disposed on one surface of the base layer BSL. In an embodiment, at least one insulating layer may be interposed between the base layer BSL and the first connecting portion CP1.

The first and second electrode portions EP1 and EP2 and at least one second connecting portion CP2 may be disposed on one surface of the base layer BSL disposed on the first insulating layer INS1. In some embodiments, a pair of first electrode portions EP1 adjacent to each other may be electrically connected to each other through each of the contact holes CH and the first connecting portion CP1. The second electrode portions EP2 and the second connecting portion CP2 of each of the second touch sensor electrode TSE2 may be integrally connected on the first insulating layer INS1.

In some embodiments, at least one second insulating layer INS2 may be disposed on one surface of the base layer BSL where the first and second touch sensor electrodes TSE1 and TSE2 are disposed. The second insulating layer INS2 may be made of the same insulating material as or an insulating material different from that of the first insulating layer INS1.

FIG. 7 shows that the first connecting portion CP1 is disposed under the first and second electrode portions EP1 and EP2, for example, a touch sensor having a low bridge structure. In another embodiment, the first connecting portion CP1 may be disposed on top of the first and second electrode portions EP1 and EP2 to form a touch sensor having a high bridge structure.

The first and second electrode portions EP1 and EP2 and the first and second connecting portions CP1 and CP2 may have conductivity because they contain a metallic material, a transparent conductive material, and at least one of various other conductive materials. For example, the first and second electrode portions EP1 and EP2 and the first and second connecting portions CP1 and CP2 may include at least one of various metallic materials such as gold (Au), silver (Ag), aluminum (Al), molybdenum (Mo), chromium (Cr), titanium (Ti), nickel (Ni), neodymium (Nd), copper (Cu), platinum (Pt), or alloys thereof. The first and second electrode portions EP1 and EP2 and the first and second connecting portions CP1 and CP2 may include at least one of various transparent conductive materials such as silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), a carbon nanotube, and graphene. Further, the first and second electrode portions EP1 and EP2 and the first and second connecting portions CP1 and CP2 may include at least one of various conductive materials that can provide conductivity. The first and second electrode portions EP1 and EP2 and the first and second connecting portions CP1 and CP2 may be respectively formed as a single layer or multiple layers, and their structures are not specifically limited.

In one embodiment, the first and second electrode portions EP1 and EP2 and the second connecting portion CP2 may be substantially transparently formed because they include a transparent conductive material. Alternatively, the first and second electrode portions EP1 and EP2 and the second connecting portion CP2 may form a mesh-shaped electrode or pattern so that transmittance above a predetermined level is obtained. Accordingly, light emitted from the display element layer DPL may be transmitted through the sensing element layer SSL. The first connecting portion CP1 having a relatively small area may be formed of a metallic material that has relatively low resistance. Accordingly, transparency of the sensing element layer SSL can be obtained and a signal delay can be prevented.

Figure 8:
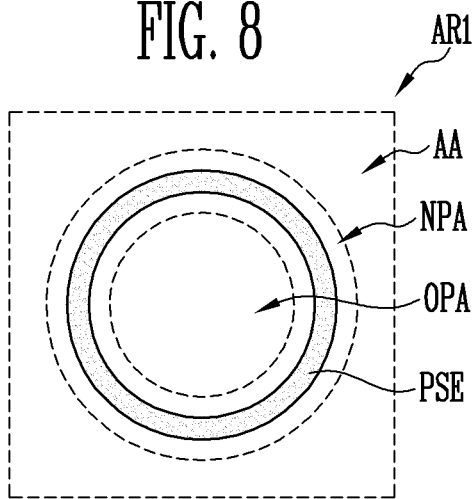
FIG. 8 is a plan view of an area AR1 of FIG. 1, illustrating a non-pixel area and a proximity sensor electrode disposed in the non-pixel area, according to an embodiment.

FIG. 8 is a plan view of an area AR1 of FIG. 1, illustrating a non-pixel area NPA and a proximity sensor electrode PSE disposed in the non-pixel area NPA, according to an embodiment.

Referring to FIG. 8, a non-pixel area NPA surrounds an opening area OPA, and may have a shape corresponding to the opening area OPA. A perimeter of the non-pixel area NPA may be similar to a perimeter of the opening Area OPA. For example, when the opening area OPA has a circular shape, the non-pixel area NPA may have an annular shape. At least one proximity sensor electrode PSE may be disposed in the non-pixel area NPA.

The proximity sensor electrode PSE may surround the opening area OPA. For example, the proximity sensor electrode PSE may have a closed-loop structure that surrounds the opening area OPA.

The proximity sensor electrode PSE may have a shape that corresponds to the opening area OPA. A perimeter of the proximity electrode PSE may be similar to a perimeter of the opening area OPA. For example, when the opening area OPA has a circular shape, the proximity sensor electrode PSE may have an annular shape. In an embodiment, the proximity sensor electrode PSE may have a shape substantially different from the shape of the opening region OPA.

The proximity sensor electrode PSE may have a uniform width. In other embodiments, sections of the proximity sensor electrode PSE may have different widths.

The proximity sensor electrode PSE may form a capacitive type proximity sensor. For example, the proximity sensor electrode PSE may form a self-capacitive type proximity sensor. For this purpose, the proximity sensor electrode PSE may include at least one conductive layer.

In addition to the touch sensor electrodes TSE, the proximity sensor electrode PSE may be disposed on the sensing element layer SSL. In one embodiment, the proximity sensor electrode PSE may include at least one conductive layer that is formed on the same layer as and in the same process as those of the touch sensor electrodes TSE. In this case, efficiency of the process can be improved, and a thickness of the sensing element layer SSL can be minimized.

For example, referring to FIGS. 6, 7, and 8, the proximity sensor electrode PSE may include at least one conductive layer (first conductive layer) that is formed on the same layer as and in the same process as those of the first and second electrode portions EP1 and EP2 and/or at least one conductive layer (second conductive layer) that is formed on the same layer as and in the same process as those of the first connecting portion CP1. In this case, the proximity sensor electrode PSE may include at least one conductive layer that is made of the same material as the first and second electrode portions EP1 and EP2 and/or at least one conductive layer that is made of the same material as the first connecting portion CP1.

FIGS. 9A to 9E show shapes/structures of an opening area OPA, a non-pixel area NPA, and a proximity sensor electrode PSE according to embodiments. Some characteristics of some structures illustrated in one or more of FIG. 9A to FIG. 9E may be the same as or similar to some characteristics of some structures illustrated in FIG. 8.

Referring to FIGS. 9A to 9E, an opening area OPA and a non-pixel area NPA may have shapes that correspond to each other, and their shapes may be configured according to embodiments. In another embodiment, an outer edge of the non-pixel area NPA may have a predetermined shape regardless of the shape of the opening area OPA.

Figure 9A:
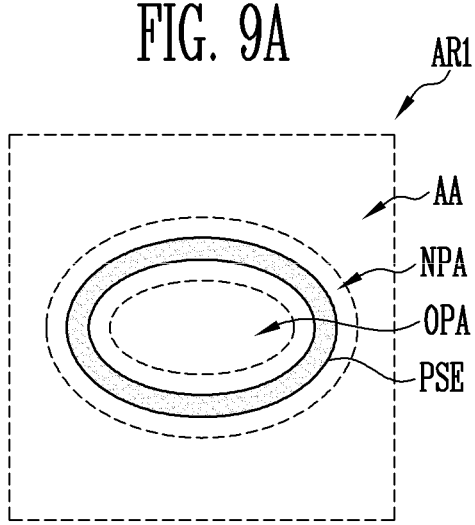
FIG. 9A shows a plan view illustrating an opening area, a non-pixel area, and a proximity sensor electrode according to an embodiment.

In one embodiment, the opening area OPA has an elliptical shape as shown in FIG. 9A, and correspondingly, the non-pixel area NPA may have an elliptical closed-loop shape. The proximity sensor electrode PSE may have a shape corresponding to the shapes of the opening area OPA and/or the non-pixel area NPA. For example, as shown in FIG. 9A, the proximity sensor electrode PSE may have an elliptical closed-loop shape corresponding to the shape of the opening area OPA and the non-pixel area NPA.

Figure 9B:
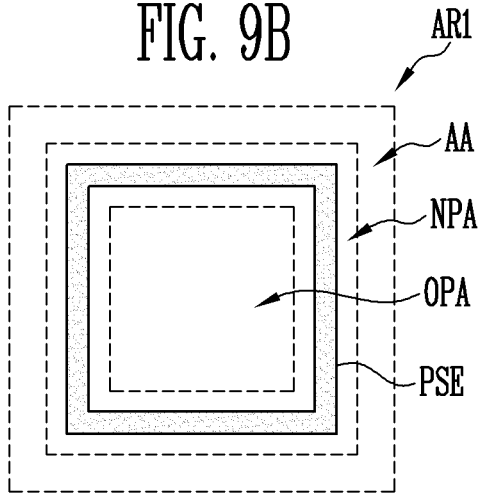
FIG. 9B shows a plan view illustrating an opening area, a non-pixel area, and a proximity sensor electrode according to an embodiment.
Figure 9C:
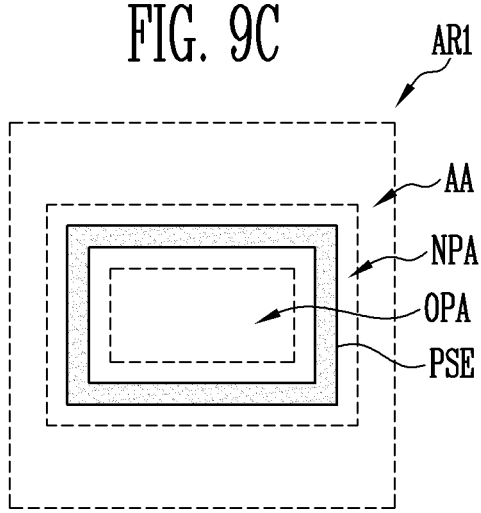
FIG. 9C shows a plan view illustrating an opening area, a non-pixel area, and a proximity sensor electrode according to an embodiment.
Figure 9D:
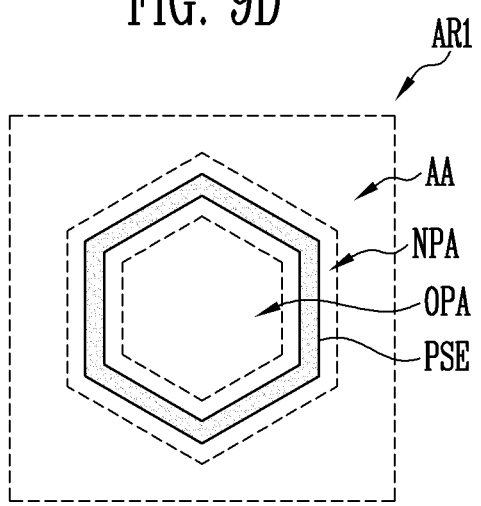
FIG. 9D shows a plan view illustrating an opening area, a non-pixel area, and a proximity sensor electrode according to an embodiment.

In another embodiment, the opening area OPA has a polygonal shape, such as one of a square, a rectangle, a regular hexagon, etc., as shown in FIGS. 9B to 9D, and the non-pixel area NPA may have a corresponding polygonal closed-loop shape. In this case, the proximity sensor electrode PSE may have a shape corresponding to the shapes of the opening area OPA and/or the non-pixel area NPA. For example, the proximity sensor electrode PSE may have a polygonal closed-loop shape that corresponds to the shapes of the opening area OPA and the non-pixel area NPA.

Figure 9E:
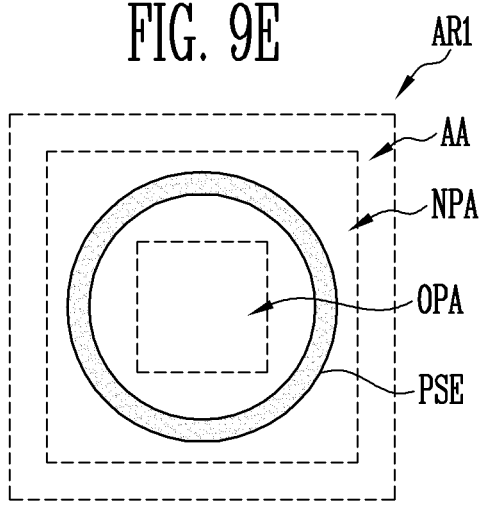
FIG. 9E shows a plan view illustrating an opening area, a non-pixel area, and a proximity sensor electrode according to an embodiment.

In another embodiment, the proximity sensor electrode PSE may have a predetermined shape irrespective of the shapes of the opening area OPA and/or the non-pixel area NPA. For example, as shown in FIG. 9E, the opening area OPA and the non-pixel area NPA respectively have a square shape and a square closed-loop shape corresponding to the square shape, but the proximity sensor electrode PSE may have a circular closed-loop shape.

The shape(s) of the proximity sensor electrode PSE may be configured according to embodiments. In a plan view of the display device, the proximity sensor electrode PSE may have one of circular, elliptical, and polygonal shapes, or a closed loop shape of a combination of some of these shapes. The proximity sensor electrode PSE does not necessarily have a closed loop shape. In another embodiment, the proximity sensor electrode PSE may have a "C" shape or "⊏" shape.

FIG. 10 and FIG. 11 are cross-sectional views of embodiments of the area AR1 of the display device shown in FIG. 1 according to embodiments.

Referring to FIGS. 10 and 11 together with FIGS. 1 to 9, the display device 10 includes a display panel PNL that includes a through-hole HOL that corresponds to an opening area OPA. The display device 10 may include at least one of a bottom cover BCV that is disposed under the display panel PNL, a first adhesive layer ADH1 that is interposed between the display panel PNL and the bottom cover BCV, a window WIN that is disposed above the display panel PNL, and a second adhesive layer ADH2 that is interposed between the display panel PNL and the window WIN.

The display panel PNL may include a backplane layer BPL and may include a light-emitting element layer ELL, an encapsulation layer ENL, and a sensing element layer SSL that are sequentially disposed on the backplane layer BPL. The backplane layer BPL, the light-emitting element layer ELL, and the encapsulation layer ENL may form the display element layer DPL.

The display panel PNL may include a through-hole HOL that corresponds to an opening area OPA. The backplane layer BPL, the light-emitting element layer ELL, the encapsulation layer ENL, and the sensing element layer SSL may respectively include portions of the through-hole HOL that correspond to the opening area OPA.

Referring to FIG. 4 and FIG. 5, the backplane layer BPL may include a base substrate SUB that supports pixels PXL. The backplane layer BPL may include a circuit element layer where a pixel circuit PXC is formed.

The light-emitting element layer ELL may include a first pixel electrode layer PEL1 including first pixel electrodes PXE1 that are disposed in pixel areas PXA, an emission layer EML disposed on the first pixel electrode layer PEL1 and including light generation layers LGL, and a second pixel electrode layer PEL2, which includes a second pixel electrode PXE2 that is disposed on the emission layers EML and overlap multiple first pixel electrodes PXE1. The first pixel electrode layer PEL1, the emission layer EML, and the second pixel electrode layer PEL2 may respectively include through-holes HOL that correspond to the opening area OPA.

The first pixel electrode layer PEL1 may include a through-hole HOL that corresponds to the opening area OPA. The emission layer EML and the second pixel electrode layer PEL2 may each include a through-hole HOL that corresponds to both the opening area OPA and a non-pixel area NPA. Portions of the first pixel electrodes PXE1 of the first pixel electrode layer PEL1, first and second common layers HCL and ECL of the emission layer EML and the light generation layer LGL, and the second pixel electrode PXE2 of the second pixel electrode layer PEL2 may be removed from the opening area OPA and the non-pixel area NPA. Accordingly, parasitic capacitance generated between the display element layer DPL (for example, the light-emitting element layer ELL) and the sensor electrode PSE can be minimized, for reducing or preventing a noise (e.g., display noise) introduced into the proximity sensor electrode PSE. Advantageously, reliability of the proximity sensor may be ensured.

The first pixel electrode layer PEL1 may include a first guard electrode GDE1 that is disposed in the non-pixel area NPA and overlaps the proximity sensor electrode PSE. The first guard electrode GDE1 may be disposed on the same layer as the first pixel electrodes PXE1 and may be separated (and insulated) from the first pixel electrodes PXE1. The first guard electrode GDE1 may be made of the same material as the first pixel electrodes PXE1. In this case, when forming the first pixel electrodes PXE1, the first guard electrode GDE1 can be simultaneously formed to improve efficiency of the process.

The first guard electrode GDE1 may be supplied with the same non-zero voltage or signal as that received by the proximity sensor electrode PSE. For example, the first guard electrode GDE1 may be connected to one of input/output terminals of a sensor driver SDR to which the proximity sensor electrode PSE is connected. In this case, the proximity sensor electrode PSE and the first guard electrode GDE1 may substantially have the same potential. Accordingly, as the first guard electrode GDE1 is formed, a change in a voltage of the proximity sensor electrode PSE due to the parasitic capacitance can be prevented, and a noise generated around the proximity sensor electrode PSE can be shielded.

The first guard electrode GDE1 may be disposed below the proximity sensor electrode PSE and may overlap the proximity sensor electrode PSE. In one embodiment, the first guard electrode GDE1 may substantially have the same shape and width as the proximity sensor electrode PSE and may overlap the proximity sensor electrode PSE. The first guard electrode GDE1 may the same shape and area as the proximity sensor electrode PSE within a predetermined tolerance range and may completely overlap the proximity sensor electrode PSE. In this case, an effect of shielding noise by the first guard electrode GDE1 can be optimized.

The encapsulation layer ENL may be disposed on the light-emitting element layer ELL, and the sensing element layer SSL may be disposed on the encapsulation layer ENL. For example, the encapsulation layer ENL is disposed between the light-emitting element layer ELL and the sensing element layer SSL, and the touch sensor electrodes TSE and the proximity sensor electrode PSE of the sensing element layer SSL may be directly formed on and/or disposed on the encapsulation layer ENL (or at least one insulating layer formed on the encapsulation layer ENL).

The touch sensor electrodes TSE and the proximity sensor electrode PSE may be formed on the encapsulation layer ENL using the encapsulation layer ENL as a base member. In some embodiments, at least one insulating layer may be interposed between the touch sensor electrodes TSE and the encapsulation layer ENL and between the proximity sensor electrode PSE and the encapsulation layer ENL.

The encapsulation layer ENL may include a through-hole HOL that corresponds to the opening area OPA. In one embodiment, the encapsulation layer ENL may be a hard encapsulation substrate ENC that is made of glass or plastic. Referring to FIG. 10, the encapsulation layer ENL may be an encapsulation substrate ENC that includes the through-hole HOL corresponding to the opening area OPA. In some embodiments, a protective film may be formed on a side of the light-emitting element layer ELL that is adjacent to the through hole HOL, thereby protecting the light-emitting element layer ELL.

In another embodiment, referring to FIG. 11, the encapsulation layer ENL may be a thin film encapsulation layer TFE that includes the through-hole HOL corresponding to the opening area OPA. When the encapsulation layer ENL is a thin film encapsulation layer TFE, the encapsulation layer ENL may extend into the through-hole HOL that is formed in the light-emitting element layer ELL. For example, area portion of the encapsulation layer ENL may be disposed inside the through hole of the light-emitting element layer ELL and may be disposed in the non-pixel area NPA.

The sensing element layer SSL may be disposed on the display element layer DPL, which includes the backplane layer BPL, the light-emitting element layer ELL, and the encapsulation layer ENL. The sensing element layer SSL may include the touch sensor electrodes TSE that are disposed in the active area AA, and the proximity sensor electrode PSE that is disposed in the non-pixel area NPA.

The sensing element layer SSL may include a through-hole HOL corresponding to the opening area OPA. The display panel PNL including the display element layer DPL and the sensing element layer SSL may include a through-hole HOL that corresponds to the opening area OPA.

A window WIN and a bottom cover BCV may be respectively disposed above and below the display panel PNL. The window WIN may completely cover a top surface of the display panel PNL, and the bottom cover BCV may completely cover a bottom surface of the display panel PNL.

The window WIN and the bottom cover BCV may cover both the top and bottom surfaces of the opening area OPA. The top and bottom of the through-hole HOL may be respectively covered by the window WIN and the bottom cover BCV. In another embodiment, at least one of the window WIN and the bottom cover BCV may be partially opened in an area corresponding to the opening area OPA, thereby exposing the through-hole HOL of the display panel PNL. In this case, the display device 10 may include a through-hole HOL that is exposed at the top and/or bottom.

A first adhesive layer ADH1 may be disposed between the display panel PNL and the bottom cover BCV. The first adhesive layer ADH1 may cover a top surface of the bottom cover BCV. In an embodiment, the first adhesive layer ADH1 may be removed from the opening area OPA.

A second adhesive layer ADH2 may be disposed between the display panel PNL and the window WIN. In one embodiment, the second adhesive layer ADH2 may be formed on a bottom surface of the window WIN. In an embodiment, a portion of the second adhesive layer ADH2 may be removed from the opening area OPA.

Figure 12:
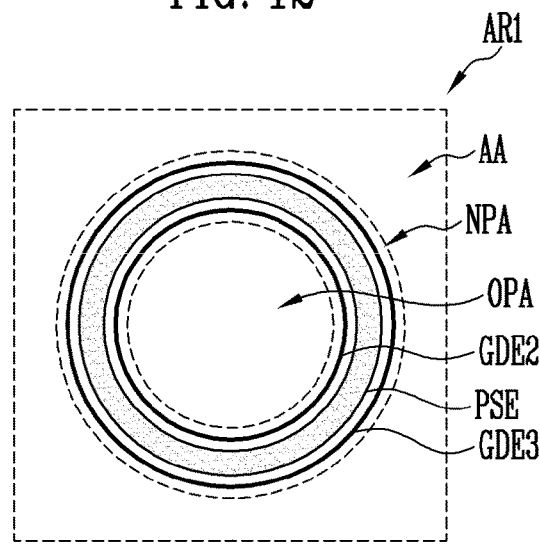
FIG. 12 is a plan view of the area AR1 of FIG. 1, illustrating a non-pixel area and a plurality of electrodes disposed in the non-pixel area, according to an embodiment.
Figure 13:
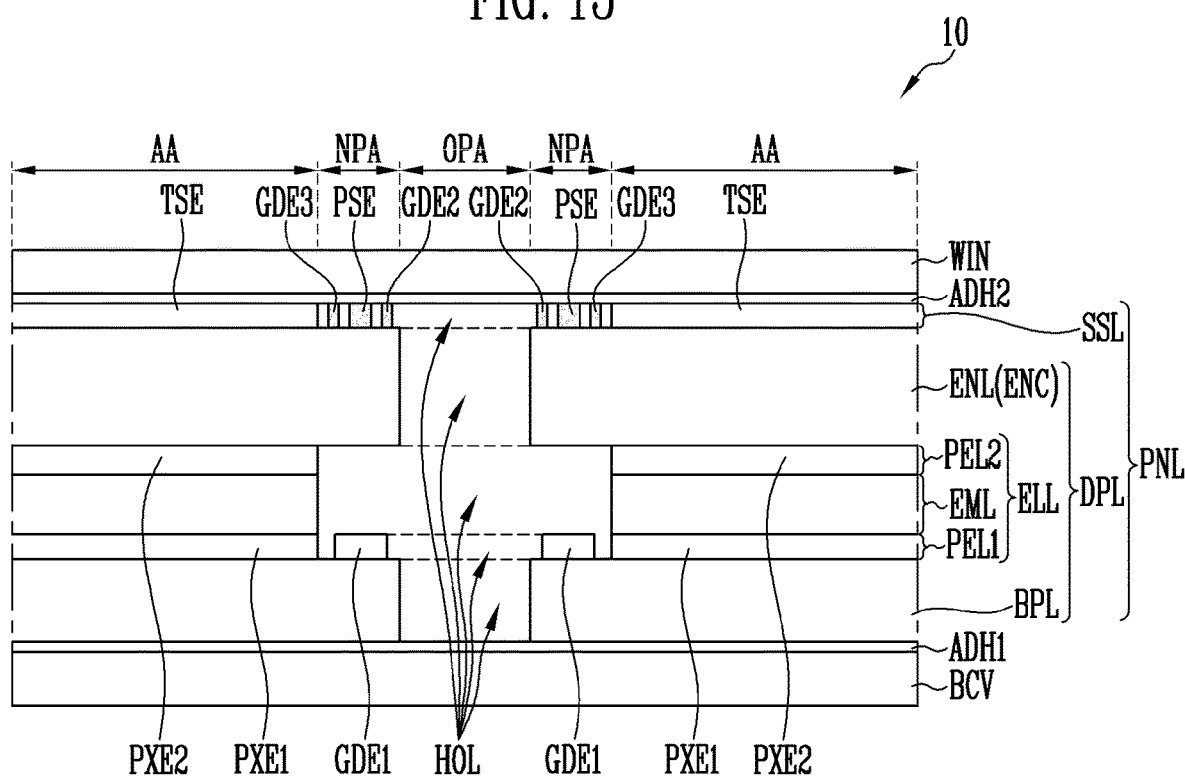
FIG. 13 is a cross-sectional view of the area AR1 of FIG. 12 according to an embodiment.
Figure 14:
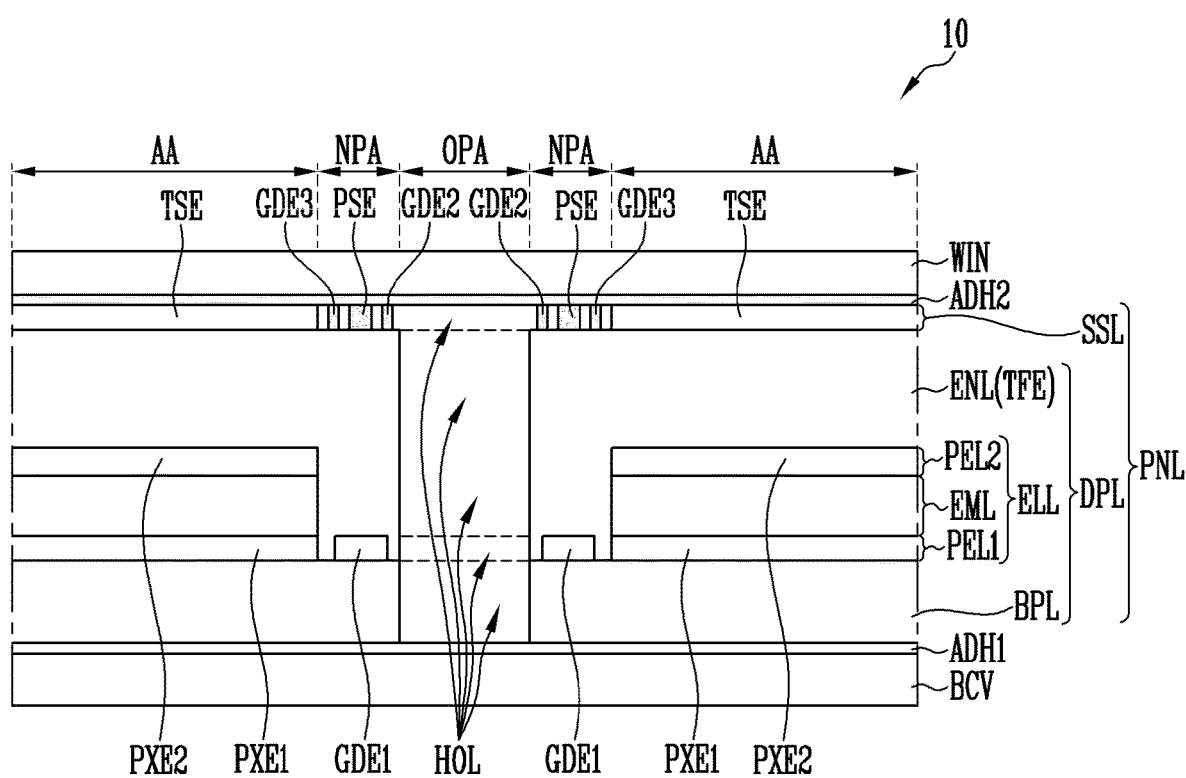
FIG. 14 is a cross-sectional view of the area AR1 of FIG. 12 according to an embodiment.

FIG. 12 is a plan view of an area AR1 of FIG. 1, illustrating a non-pixel area NPA and a plurality of electrodes disposed in the non-pixel area NPA, according to an embodiment. FIG. 13 and FIG. 14 are cross-sectional view of the area AR1 according to the embodiments. Some characteristics of some components illustrated in FIGS. 12 to 14 may be the same or similar to some characteristics of some components illustrated in FIGS. 8, 10, and 11.

Referring to FIG. 12 to FIG. 14, a display device 10 may include at least one of a second guard electrode GDE2 and a third guard electrode GDE3 that are disposed in a non-pixel area NPA and in a sensing element layer SSL. The sensing element layer SSL may include the second guard electrode GDE2 and the third guard electrode GDE3 that are disposed in the non-pixel area NPA together with a proximity sensor electrode PSE.

The second guard electrode GDE2 may be positioned inside the proximity sensor electrode PSE and may be separated (and insulated) from the proximity sensor electrode PSE. The second guard electrode GDE2 may be positioned between an opening area OPA and the proximity sensor electrode PSE and may be positioned between two opposite portions of the proximity sensor electrode PSE.

The third guard electrode GDE3 may be positioned outside of the proximity sensor electrode PSE and may be separated (and insulated) from the proximity sensor electrode PSE. The third guard electrode GDE3 may be positioned between the touch sensor electrodes TSE and the proximity sensor electrode PSE.

The second guard electrode GDE2 and the third guard electrode GDE3 may be supplied with the same non-zero voltage or signal as that received by the proximity sensor electrode PSE. The second and third guard electrodes GDE2 and GDE3 may be connected to one of input/output terminals of a sensor driver (SDR in FIG. 2) to which the proximity sensor electrode PSE is connected. The proximity sensor electrode PSE and the second and third guard electrodes GDE2 and GDE3 may substantially have the same potential. Accordingly, a voltage variation of the proximity sensor electrode PSE due to parasitic capacitance can be prevented, and a noise generated around the proximity sensor electrode PSE can be more effectively shielded.

The second and third guard electrodes GDE2 and GDE3 may be formed of the same material as that of the proximity sensor electrode PSE and formed on the same layer as the proximity sensor electrode PSE. The second and third guard electrodes GDE2 and GDE3 may be formed together when forming the proximity sensor electrode PSE without requiring an additional process.

Figure 15:
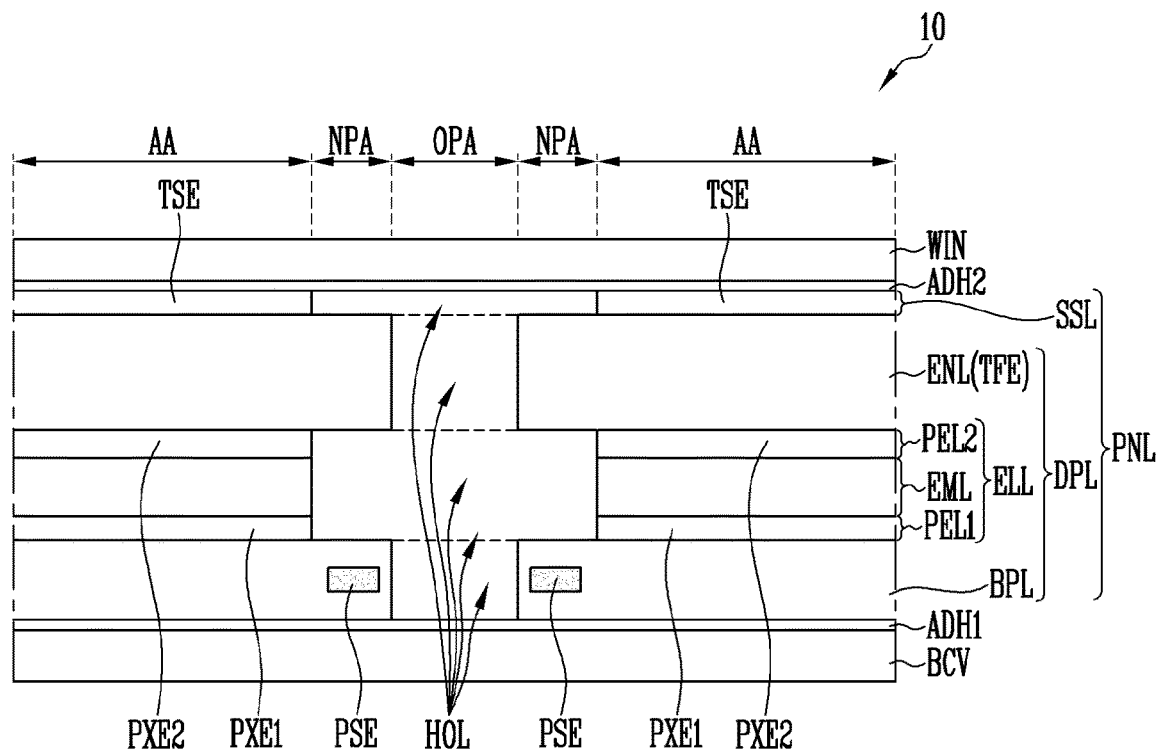
FIG. 15 is a cross-sectional view of an area AR1 of a display device according to an embodiment.
Figure 16:
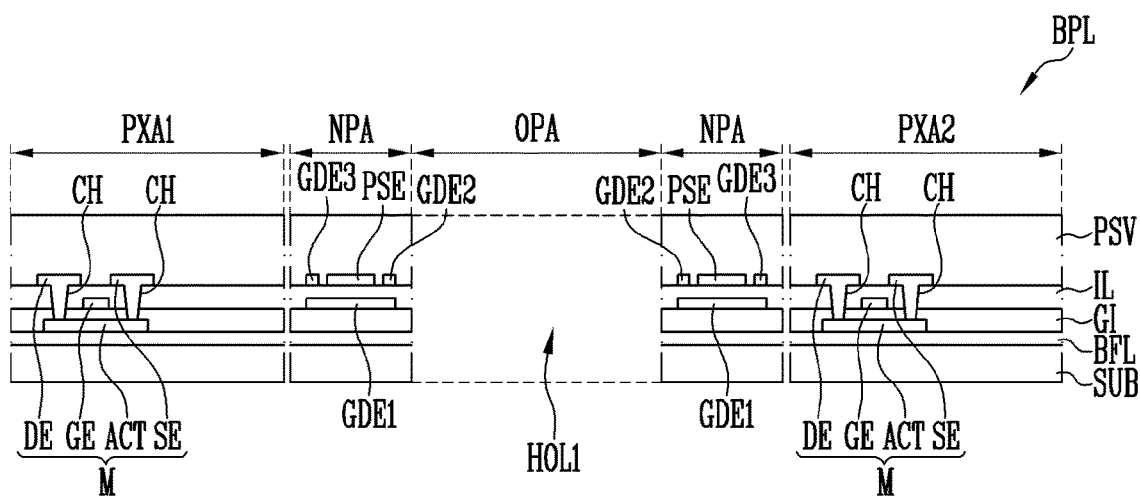
FIG. 16 is a cross-sectional view of a backplane layer according to an embodiment.

FIG. 15 is a cross-sectional view of an area AR1 of the display device 10 according to an embodiment. FIG. 16 is a cross-sectional view of a backplane layer BPL according to an embodiment. FIG. 16 shows that a proximity sensor electrode PSE is disposed on a display element layer DPL, for example, on a backplane layer BPL illustrated in FIG. 15. For ease of description, in FIG. 16, two pixel areas PXA1 and PXA2 disposed at different sides of an opening area OPA are shown, and circuit elements and/or wires including one transistor M is schematically shown. The transistor M may substantially have the same cross-sectional structure as the second transistor M2 disclosed in FIG. 5. Descriptions related to components that are same as or similar to above-described components may not be repeated.

Referring to FIG. 15 and FIG. 16, the proximity sensor electrode PSE may be disposed on/in the display element layer DPL. For example, the proximity sensor electrode PSE may be disposed inside the backplane layer BPL of the display element layer DPL.

The backplane layer BPL includes a proximity sensor electrode PSE that is disposed in the non-pixel area NPA, and may further include at least one guard electrode that is disposed around the proximity sensor electrode PSE. For example, the backplane layer BPL may include a proximity sensor electrode PSE that is disposed in the non-pixel area NPA, and may include first, second and third guard electrodes GDE1, GDE2, and GDE3 that are disposed near the proximity sensor electrode PSE.

The proximity sensor electrode PSE, and the first, second, and third guard electrodes GDE1, GDE2, and GDE3 may be disposed/included in the same layers as the circuit elements and/or wires. For example, the first guard electrode GDE1 is disposed/included in a gate layer (also referred to as a "first gate layer") that includes a gate electrode GE of the transistors M, and the proximity sensor electrode PSE and the second and third guard electrodes GDE2 and GDE3 may be disposed/included in a source-drain layer that includes a source electrode SE and a drain electrode DE of the transistors M. In an embodiment, at least one of the proximity sensor electrode PSE, the first guard electrode GDE1, and the second guard electrode GDE2, the third guard electrode GDE3, and an electrode of a capacitor C of each pixel PXL may be disposed/included in a conductive layer (also referred to as a "second gate layer") between the gate layer and the source-drain layer, or may be disposed/included in a semiconductor layer that includes an active layer ACT of the transistors M.

When forming the circuit elements of the pixels PXL and/or the wires connected to the pixels PXL, the proximity sensor electrode PSE and/or at least one guard electrode may be formed at the same time. Accordingly, the proximity sensor may be formed inside a display panel PNL (for example, the backplane layer BPL) without requiring additional components or processes.

Figure 17:
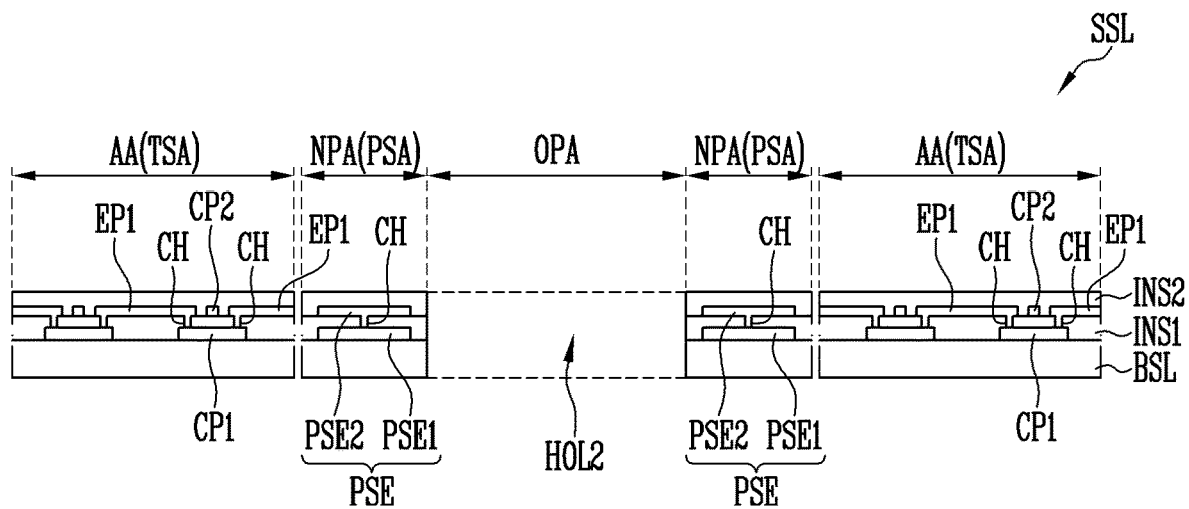
FIG. 17 is a cross-sectional view of a sensing element layer according to an embodiment.
Figure 18:
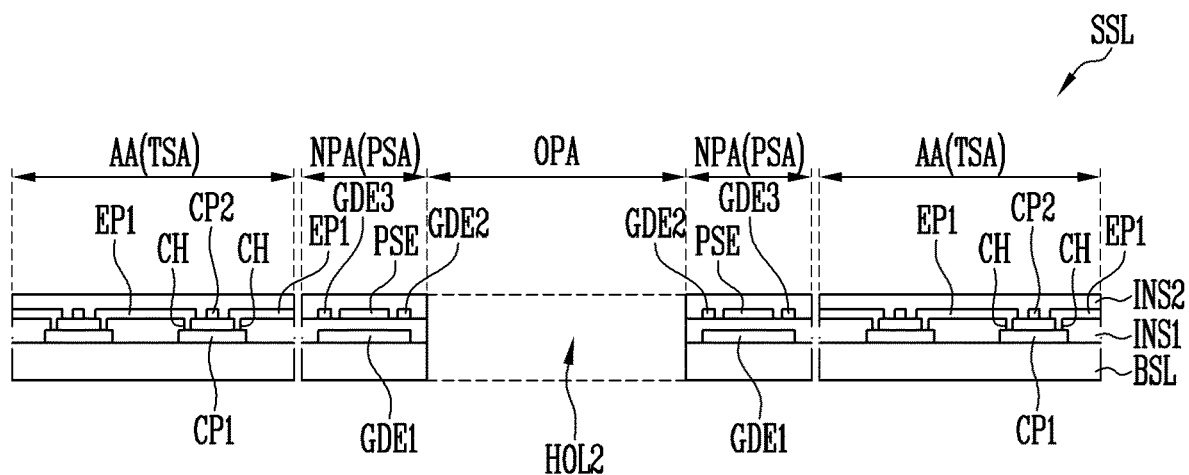
FIG. 18 is a cross-sectional view of a sensing element layer according to an embodiment.

Each of FIG. 17 and FIG. 18 is a cross-sectional view of a sensing element layer SSL according to an embodiment. FIG. 17 that a proximity sensor electrode PSE and touch sensor electrodes TSE each include a multi-layered structure, and FIG. 18 shows that the proximity sensor electrode PSE and first to third guard electrodes GDE1, GDE2, and GDE2 are all formed in a sensing element layer SSL. Descriptions related to components that are the same as or similar to above-described components may not be repeated.

Referring first to FIGS. 1 to 17, the proximity sensor electrode PSE may have a multi-layered structure. For example, the proximity sensor electrode PSE may have a first conductive layer PSE1 and a second conductive layer PSE2. The first conductive layer PSE1 may be disposed in the same layer as at least some of connecting portions (first and/or second connecting portions CP1 and CP2) of touch sensor electrodes TSE. The second conductive layer PSE2 may be electrically connected to the first conductive layer PSE1 and may be disposed in the same layer as electrode portions (first and/or second electrode portions EP1 and EP2) of the touch sensor electrodes TSE.

The first conductive layer PSE1 may be disposed on/in the same layer as the first connecting portions CP1 of the touch sensor electrodes TSE. The second conductive layer PSE2 may be disposed on/in the same layer as the first and second electrode portions EP1 and EP2 of the touch sensor electrodes TSE and second connecting portions CP2 of the touch sensor electrodes TSE. The first conductive layer PSE1 may include the same metallic material as that of the first connecting portions CP1 and may be disposed on/in the same layer as the first connecting portions CP1. The second conductive layer PSE2 may include the same transparent conductive material as that of the first and second electrode portions EP1 and EP2 and that of the second connecting portions CP2, and may be disposed on/in the same layer as the first and second electrode portions EP1 and EP2 and the second connecting portions CP2.

The first conductive layer PSE1 and the second conductive layer PSE2 may substantially have the same shape and area and may overlap each other. The first conductive layer PSE1 and the second conductive layer PSE2 may be electrically connected to each other through at least one contact hole CH that penetrates through a first insulating layer INS1. It is possible to simultaneously form the proximity sensor electrodes PSE having a multi-layered structure when forming the touch sensor electrodes TSE, without requiring an additional process.

When the proximity sensor electrode PSE has the multi-layered structure, a total area of the proximity sensor electrode PSE may be increased to increase capacitance that is used for proximity sensing. Accordingly, sensitivity of the proximity sensor may be improved.

Referring to FIG. 18, all of the proximity sensor electrode PSE and the first to third guard electrodes GDE1, GDE2, and GDE3 may be disposed in the sensing element layer SSL. The first guard electrode GDE1 may be disposed on/in the same layer as the first connecting portions CP1 of the touch sensor electrodes TSE, and the proximity sensor electrode PSE and the second and third guard electrodes GDE2 and GDE3 may be disposed on/in the same layer as the first and second electrode portions EP1 and EP2 and the second connecting portions CP2 of the touch sensor electrodes TSE. In another embodiment, the first and second electrode portions EP1 and EP2 and the second connecting portions CP2 of the touch sensor electrodes TSE may be disposed below the first connecting portions CP1, the first guard electrode GDE1 may be disposed on/in the same layer as the first and second electrode portions EP1 and EP2 and the second connecting portions CP2, and the proximity sensor electrode PSE and the second and third guard electrodes GDE2 and GDE3 may be disposed on/in the same layer as the first connecting portions CP1. The proximity sensor electrode PSE and the guard electrodes may be simultaneously formed when forming the touch sensor electrodes, without requiring additional processes.

Figure 19:
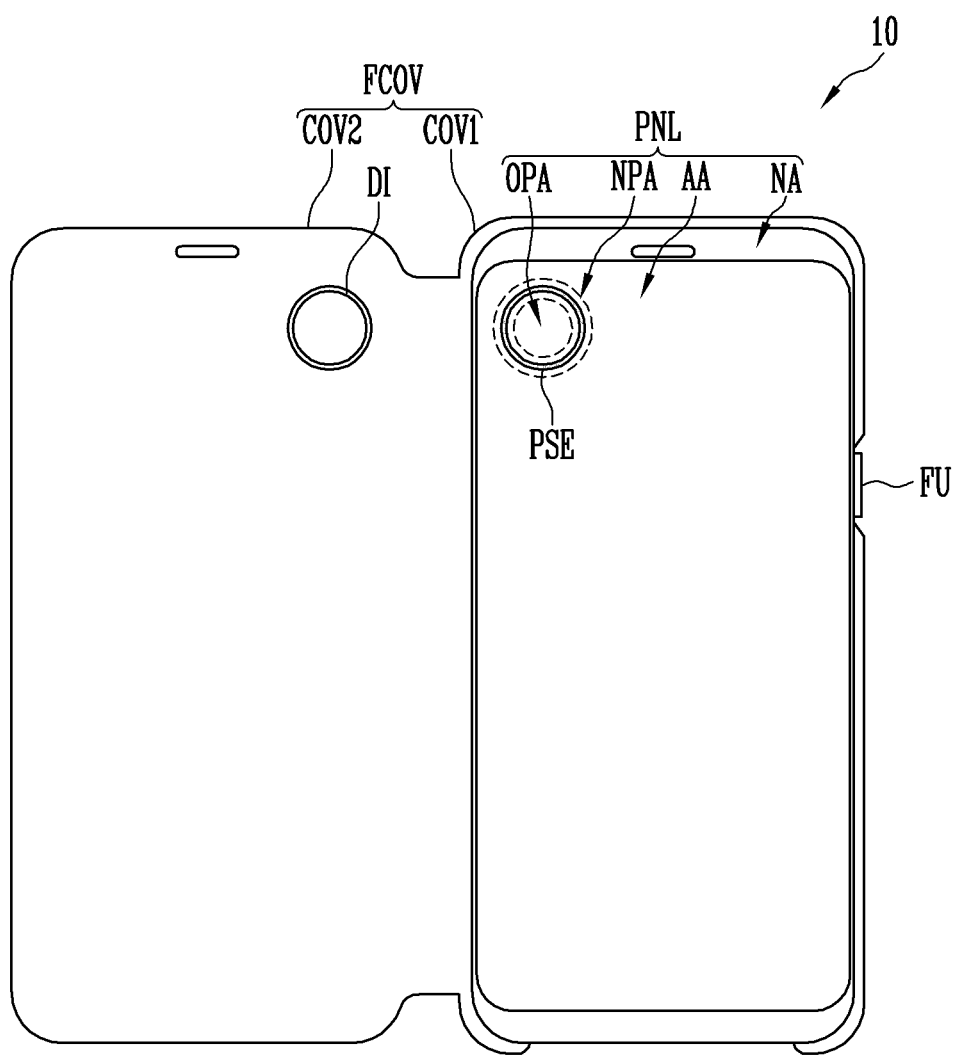
FIG. 19 shows schematic plan view illustrating a display device with an opened cover according to an embodiment.

FIG. 19 shows a display device 10 according to an embodiment. FIG. 19 shows that a full cover case FCOV is added to the display device 10 according to one or more of the embodiments of FIGS. 1 to 18. In some embodiments, the full cover case FCOV may be considered as a separate component that can be combined with the display device 10.

Referring to FIG. 1 to FIG. 19, the full cover case FCOV may accommodate and protect a display element layer DPL and a sensing element layer SSL. The full cover case FCOV may include a rear case portion (or rear cover) and a front case portion (or front cover). The rear case portion COV1 may substantially accommodate the display panel PNL and may cover a bottom surface of the display panel PNL. The front case portion COV2 may be (directly) connected to the rear case portion COV1.

The front case portion COV2 may be opened and closed in a flip manner to reveal and cover a top surface of the display panel PNL. The front case portion COV2 may include a dielectric part DI positioned corresponding to a proximity sensor electrode PSE. The dielectric part DI may overlap the proximity sensor electrode PSE when the front case portion COV2 is disposed on the display panel PNL.

The dielectric part DI may have the same shape and area as those of the proximity sensor electrode PSE. Because of the dielectric part DI, capacitance of the proximity sensor electrode PSE changes as the full cover case FCOV is opened or closed. Accordingly, the open/close state of the full cover case FCOV can be determined.

The described embodiments are for illustrative purposes. Practical embodiments cover various modifications and equivalent arrangements within the scope defined by the appended claims.

What is claimed is:

1. A display device comprising:
a display element layer comprising a first through hole, a non-pixel area, and a display area, the display area including pixels and surrounding the non-pixel area, the non-pixel area surrounding the first through hole;
a sensing element layer comprising a second through hole and a first sensing area, the first sensing area including first-type sensor electrodes, overlapping the display area, and surrounding the second through hole, the second through hole corresponding to the first through-hole; and
a second-type sensor electrode overlapping the non-pixel area and electrically insulated from the first-type sensor electrodes.

2. The display device of claim 1, wherein
the second-type sensor electrode surrounds the second through hole.

3. The display device of claim 2, further comprising: a first insulating layer, wherein
the first-type sensor electrodes include a first electrode and a first connector,
the first electrode overlaps the display area and directly contacts a face of the first insulating layer,
the first connector is electrically connected to the first electrode through a first contact hole in the first insulating layer,
the second-type sensor electrode includes a first conductive layer, and
the first conductive layer directly contacts the face of the first insulating layer.

4. The display device of claim 3, wherein
the second-type sensor electrode further includes a second conductive layer,
the second conductive layer is electrically connected to the first conductive layer through a second contact hole in the first insulating layer.

5. The display device of claim 2, wherein
the display element layer includes a first pixel electrode layer, an emission layer, and a second pixel electrode layer,
the first pixel electrode layer includes pixel electrodes of the pixels and includes the first through hole,
the emission layer is disposed between the first pixel electrode layer and the second pixel electrode layer and includes a third through hole,
the third through hole corresponds to both the first through hole and the non-pixel area,
the second pixel electrode layer overlaps the emission layer, overlaps the pixel electrodes, and includes a fourth through hole, and
the fourth through hole corresponds to the third through hole.

6. The display device of claim 5, wherein
the first pixel electrode layer further includes a first guard electrode,
the first guard electrode is electrically insulated from the pixel electrodes, is disposed in the non-pixel area, overlaps the second-type sensor electrode, and is configured to receive a same non-zero voltage or signal as received by the second-type sensor electrode.

7. The display device of claim 2, further comprising at least one of:
a first guard electrode overlapping the second-type sensor electrode;
a second guard electrode overlapping the non-pixel area, positioned between two portions of the second-type sensor electrode and electrically insulated from the second sensor electrode; and
a third guard electrode overlapping the non-pixel area, positioned between the first-type sensor electrodes and the second-type sensor electrode, and electrically insulated from the second-type sensor electrode.

8. The display device of claim 7, wherein
each of the first guard electrode, the second guard electrode, and the third guard electrode is configured to receive a same non-zero voltage or signal as received by the second-type sensor electrode.

9. The display device of claim 1, wherein
the second-type sensor electrode is disposed on the display element layer.

10. The display device of claim 9, further comprising:
at least one guard electrode disposed on the display element layer and positioned at a periphery of the second-type sensor electrode.

11. The display device of claim 1, wherein
the second-type sensor electrode has a closed-loop structure that surrounds the first through hole in a plan view of the display device.

12. The display device of claim 1, wherein
the first-type sensor electrodes form a mutual capacitive type touch sensor, and
the second-type sensor electrode forms a self-capacitive type proximity sensor.

13. The display device of claim 12, wherein
the first-type sensor electrodes include:
first-type electrodes arranged in a first direction;
a first-type connector electrically connecting the first-type electrodes;
second-type electrodes arranged in a second direction different from the first direction; and
a second-type connector electrically connecting the second-type electrodes.

14. The display device of claim 1, wherein
the display element layer further includes an encapsulation layer for encapsulating the pixels, and
the encapsulation layer includes a through hole that corresponds to the first through hole.

15. The display device of claim 14, wherein
the first-type sensor electrodes and the second-type sensor electrode are disposed directly on the encapsulation layer or an insulating layer that is disposed directly on the encapsulation layer.

16. The display device of claim 1, wherein
the display element layer includes a backplane layer that includes circuit elements of the pixels, and
the second-type sensor electrode is disposed directly on the backplane layer.

17. The display device of claim 1, wherein
the display device further includes a sensor driver that is electrically connected to the first-type sensor electrodes and the second-type sensor electrode, and
the sensor driver includes:
a first sensor driving circuit electrically connected to the first-type sensor electrodes and configured to sense a touch input generated on the first sensing area; and
a second sensor driving circuit electrically connected to the second-type sensor electrode and configured to sense an approach of an electrically conductive object.

18. The display device of claim 1, further comprising:
a window completely covering a first surface of a combination of the display element layer and the sensing element layer; and
a bottom cover completely covering a second surface of the combination of the display element layer and the sensing element layer.

19. The display device of claim 1, further comprising:
a rear cover for covering a rear surface of a combination of the display element layer and the sensing element layer; and
a front cover connected to the rear cover and comprising a dielectric material part at a position corresponding to the second-type sensor electrode.

20. A display device comprising:
pixels;
touch sensor electrodes;
a through hole surrounded by the pixels and surrounded by the touch sensor electrodes; and
a proximity sensor electrode disposed outside the through hole, surrounded by the touch sensor electrodes, and electrically insulated from the touch sensor electrodes.

* * * * *